US012364027B2

(12) United States Patent
Inoue et al.

(10) Patent No.: US 12,364,027 B2
(45) Date of Patent: Jul. 15, 2025

(54) PHOTO SENSOR AND DISTANCE MEASURING SYSTEM USING SAID PHOTO SENSOR

(71) Applicant: Panasonic Intellectual Property Management Co., Ltd., Osaka (JP)

(72) Inventors: Akito Inoue, Osaka (JP); Yuki Sugiura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 595 days.

(21) Appl. No.: 17/721,854

(22) Filed: Apr. 15, 2022

(65) Prior Publication Data

US 2022/0246782 A1 Aug. 4, 2022

Related U.S. Application Data

(63) Continuation of application No. PCT/JP2020/030404, filed on Aug. 7, 2020.

(30) Foreign Application Priority Data

Oct. 29, 2019 (JP) ................. 2019-196578

(51) Int. Cl.
*H10F 30/225* (2025.01)
*H10F 39/00* (2025.01)
(Continued)

(52) U.S. Cl.
CPC ......... *H10F 30/225* (2025.01); *H10F 39/103* (2025.01); *H10F 39/18* (2025.01);
(Continued)

(58) Field of Classification Search
CPC ............................ H10F 30/225; H10F 39/807
See application file for complete search history.

(56) References Cited

U.S. PATENT DOCUMENTS

2015/0281620 A1* 10/2015 Usuda ............... G01J 1/44
257/438
2016/0163906 A1 6/2016 Muscara' et al.
(Continued)

FOREIGN PATENT DOCUMENTS

JP S59-158682 A 9/1984
JP 2006-029839 A 2/2006
(Continued)

OTHER PUBLICATIONS

Ruegg, An Optimized Avalanche Photodiode, IEEE Transactions on Electron Devices, vol. ED-14, No. 5, May 1967 (Year: 1967).*
(Continued)

*Primary Examiner* — Shih Tsun A Chou
(74) *Attorney, Agent, or Firm* — Rimon P.C.

(57) ABSTRACT

A photosensor includes a plurality of avalanche photodiodes (APD) provided on a first main surface, a first isolation region that is provided on the first main surface and electrically separates the plurality of APDs from one another in a first direction, and a second isolation region that is provided on the first main surface and electrically separates the plurality of APDs from one another in a second direction different from a direction of the first isolation region. The first isolation region and the second isolation region are depleted. At least one of the first isolation region or the second isolation region is terminated at a first connection portion at which the first isolation region and the second isolation region are connected.

18 Claims, 20 Drawing Sheets

(51) Int. Cl.
      *H10F 39/10*       (2025.01)
      *H10F 39/18*       (2025.01)
      *H10F 77/00*       (2025.01)

(52) U.S. Cl.
      CPC ......... *H10F 39/807* (2025.01); *H10F 39/811* (2025.01); *H10F 77/959* (2025.01)

(56) References Cited

U.S. PATENT DOCUMENTS

| | | | |
|---|---|---|---|
| 2018/0197905 A1* | 7/2018 | Sakata | ................ H01L 27/1463 |
| 2021/0028202 A1 | 1/2021 | Inoue et al. | |

FOREIGN PATENT DOCUMENTS

| | | |
|---|---|---|
| JP | 2006-270356 A | 10/2006 |
| JP | 2018-148097 A | 9/2018 |
| WO | 2017/043068 A1 | 3/2017 |
| WO | 2019/189700 A1 | 10/2019 |

OTHER PUBLICATIONS

International Search Report dated Oct. 20, 2020 issued in International Patent Application No. PCT/JP2020/030404, with English translation.

\* cited by examiner

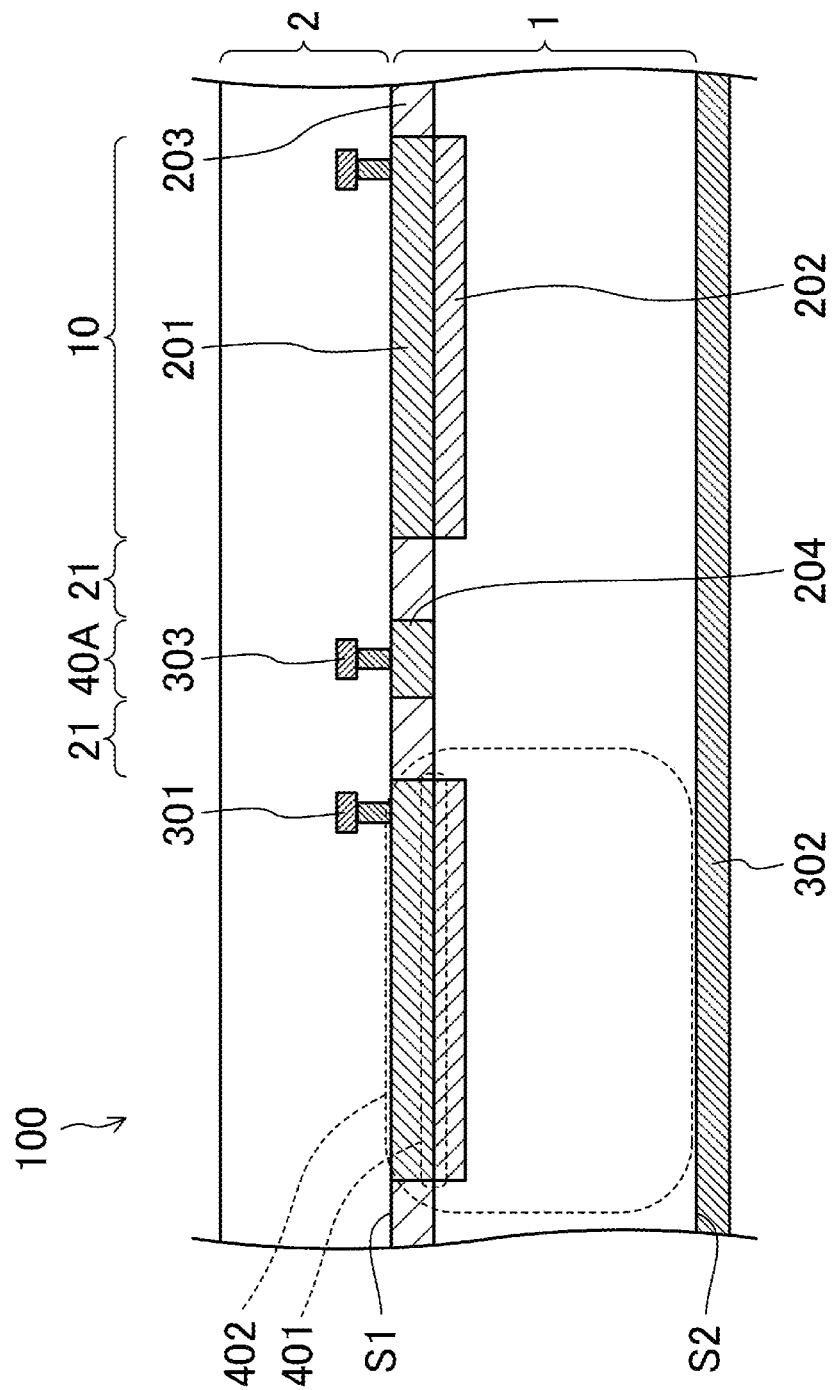

PHOTO SENSOR AND DISTANCE MEASURING SYSTEM USING SAID PHOTO SENSOR

CROSS-REFERENCE TO RELATED APPLICATIONS

This is a continuation of International Application No. PCT/JP2020/030404 filed on Aug. 7, 2020, which claims priority to Japanese Patent Application No. 2019-196578 filed on Oct. 29, 2019. The entire disclosures of these applications are incorporated by reference herein.

BACKGROUND

The present disclosure relates to a photosensor and a distance measuring system using said photo sensor.

In recent years, high-sensitivity photosensors (photodetectors) have been used in fields such as communication, in-vehicle use, monitoring, chemistry, biology, medical care, and radiation detection. An avalanche photodiode (hereinafter, also referred to as "APD") is used as one of the means for increasing the sensitivity. The APD is a photodiode that increases the detection sensitivity of incident light by multiplying signal charges generated by photoelectric conversion of light incident on a photoelectric conversion layer using avalanche breakdown. By using the APD in this manner, even a small number of photons can be detected.

For example, U.S. Patent Application Publication No. 2016/0163906 (FIG. 1) describes an APD that operates in a Geiger multiplication mode. A p-type contact layer is disposed around one APD, and this contact layer supplies a predetermined voltage to the APD, and insulates and isolates the APD from other adjacent APDs.

SUMMARY

However, in the APD described in U.S. Patent Application Publication No. 2016/0163906 (FIG. 1), a contact layer is not depleted to avoid drop of the voltage applied to a p-type semiconductor layer. In addition, an electric field relaxation layer is provided around the contact layer to avoid an electric field higher than that in the APD.

As described above, in the known technology, each APD includes the contact layer and the electric field relaxation layer, and it is necessary to ensure a sufficiently large isolation region for each APD. Therefore, there is a problem that it is difficult to further miniaturize an APD device.

It is an object of the present disclosure to solve the problems described above and to implement miniaturization of an avalanche photodiode (APD) that is a light receiving portion.

In order to achieve the above object, the present disclosure has a configuration in which isolation regions for APDs constituting the individual pixels are depleted, and in the isolation regions with different isolation directions, one isolation region terminates at a connection portion with the other isolation region. In the present specification, depletion means that "the potential of at least a part of an isolation region is different from the potential applied from an external power supply." In addition, the terminal refers to "a final portion of a series of components."

Specifically, the present disclosure is directed to a photosensor, and has taken the following solution.

That is, a first disclosure includes: a semiconductor substrate including a first main surface and a second main surface opposite to the first main surface; a plurality of avalanche photodiodes provided on the first main surface; a first isolation region that is provided on the first main surface and electrically separates the avalanche photodiodes from one another in a first direction; and a second isolation region that is provided on the first main surface and electrically separates the avalanche photodiodes from one another in a second direction different from a direction of the first isolation region. The first isolation region and the second isolation region are depleted, and at least one of the first isolation region or the second isolation region is terminated at a first connection portion at which the first isolation region and the second isolation region are connected.

A second disclosure is a distance measuring system using the photosensor of the first disclosure.

The present disclosure makes it possible to implement miniaturization of a light receiving portion in a photosensor.

BRIEF DESCRIPTION OF THE DRAWINGS

FIG. 6A is a cross-sectional view illustrating a first modification of the configuration in FIG. 6.

DETAILED DESCRIPTION

Figure 1:
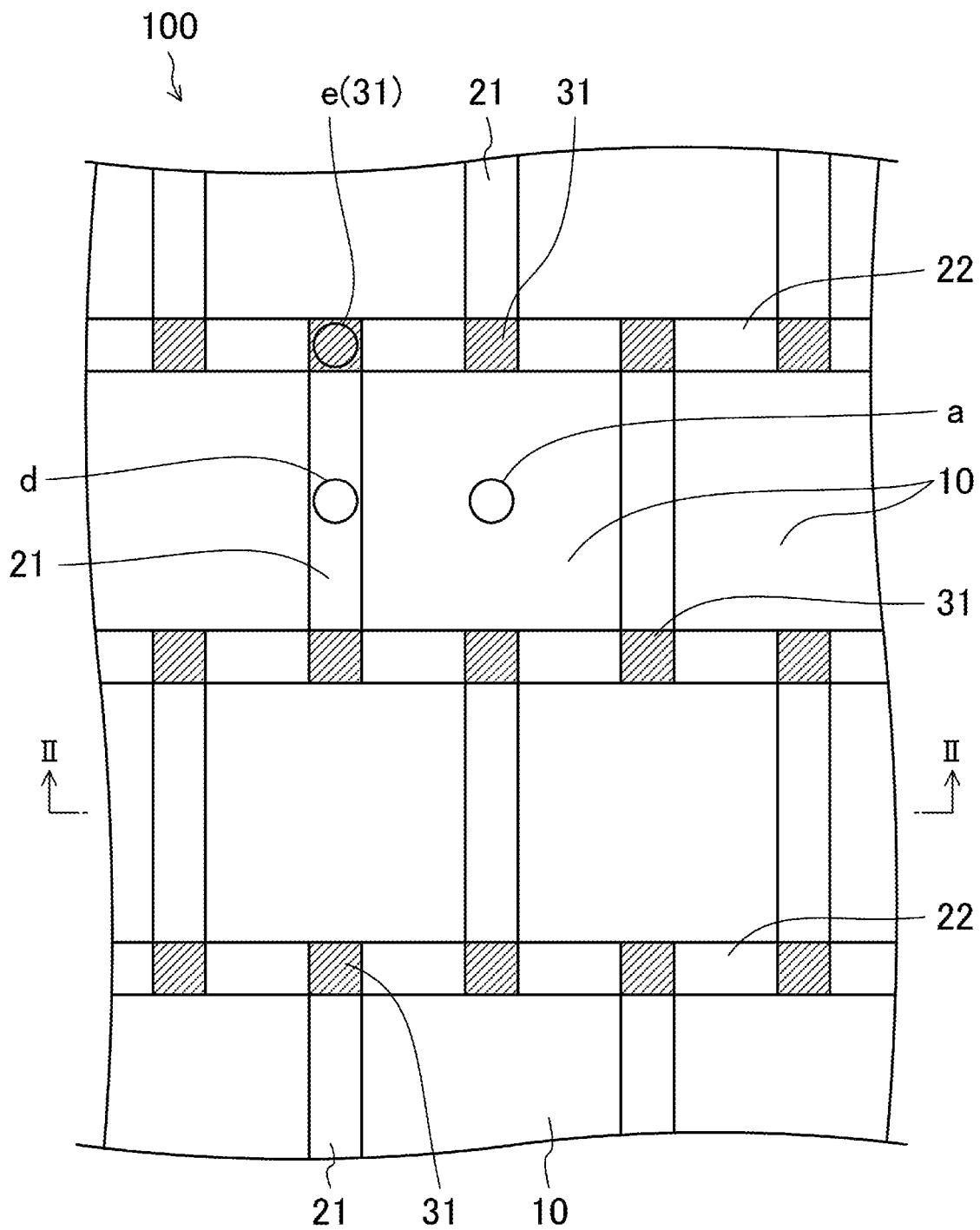
FIG. 1 is a partial plan view illustrating a part of an avalanche photodiode array in a photosensor according to a first embodiment.

A first aspect according to an embodiment of the present disclosure includes: a semiconductor substrate including a first main surface and a second main surface opposite to the first main surface; a plurality of avalanche photodiodes provided on the first main surface; a first isolation region that is provided on the first main surface and electrically separates the plurality of avalanche photodiodes from one another in a first direction; and a second isolation region that is provided on the first main surface and electrically separates the plurality of avalanche photodiodes (APDs) from one another in a second direction different from a direction of the first isolation region. The first isolation region and the second isolation region are depleted, and at least one of the first isolation region or the second isolation region is terminated at a first connection portion at which the first isolation region and the second isolation region are connected.

According to this configuration, depleting an isolation region that insulates and isolates each APD by a potential barrier can eliminate the need to provide an electric field relaxation layer. Meanwhile, the inventors of the present application have found that the potential barrier of an intersection portion of two isolation regions intersecting each other is higher than that of a side portion of each isolation region, and that by terminating one of the two isolation regions by the other, at the intersection portion (specifically, a connection portion), the potential barrier of the connection portion can be lowered. As a result, since the electric field concentration at the connection portion is relaxed, the isolation width of the isolation region can be reduced, and a light receiving portion can be miniaturized.

A second aspect is an embodiment of the first aspect. In the second aspect, each of the avalanche photodiodes may have a planar quadrangular shape, and the plurality of avalanche photodiodes may be arranged in a staggered manner.

Thus, at least one of the first isolation region or the second isolation region can be reliably terminated by the other.

A third aspect is an embodiment of the first or second aspect. In the third aspect, each of the plurality of avalanche photodiodes may include a multiplication region including a first semiconductor layer of a first conductivity type and a second semiconductor layer of a second conductivity type. The second semiconductor layer may be formed between the second main surface and the first semiconductor layer; a voltage may be applied to the first semiconductor layer from a first contact provided on the first main surface; and a voltage may be applied to the second semiconductor layer from a second contact formed on the second main surface. Here, the second contact may be metal with high conductivity or a semiconductor layer with a high impurity concentration, and in particular, the second contact may be formed by increasing the impurity concentration of the semiconductor substrate. In addition, a voltage may be applied to the semiconductor substrate, the second semiconductor layer, and the like by applying a voltage to the second contact via an arbitrary contact provided on the side of the first main surface.

According to this configuration, each avalanche photodiode can be operated.

A fourth aspect is an embodiment of the third aspect. In the fourth aspect, each of the avalanche photodiodes may include a photoelectric conversion region, and the photoelectric conversion region may include the semiconductor substrate, the multiplication region, the first semiconductor layer, and the second semiconductor layer.

A fifth aspect is an embodiment of the third or fourth aspect. In the fifth aspect, an absolute value of the voltage applied to the first contact may be smaller than an absolute value of the voltage applied to the second contact.

As a result, in a case of providing a wiring layer on the first main surface, a high electric field is less likely to be generated in the wiring layer, and thus the reliability of the wiring layer can be enhanced.

A sixth aspect is an embodiment of the first aspect. In the sixth aspect, the photodiode may further include a voltage fixation layer that is provided on the first main surface in parallel with the first isolation region or the second isolation region and is arranged between two first isolation regions or two second isolation regions among the avalanche photodiodes.

Thus, even in a case where the first isolation region and the second isolation region are arranged in a lattice pattern, one of the first isolation region or the second isolation region can be terminated by the other.

A seventh aspect is an embodiment of the first aspect. In the seventh aspect, the photodiode may further includes a third isolation region that is depleted, provided on the first main surface, and electrically separates the plurality of avalanche photodiodes from one another in a third direction different from directions of the first isolation region and the second isolation region, wherein at least one of the first isolation region, the second isolation region, or the third isolation region may be terminated at a second connection portion at which at least two of the first isolation region, the second isolation region, and the third isolation region are connected.

According to this configuration, at least one isolation region of the isolation regions in three different directions can be terminated.

An eighth aspect is an embodiment of the seventh aspect. In the eighth aspect, each of the avalanche photodiodes may have a planar hexagonal shape, and the plurality of avalanche photodiodes may be arranged in a honeycomb pattern.

As a result, at least one of the first isolation region, the second isolation region, or the third isolation region can be reliably terminated.

A ninth aspect is an embodiment of the first aspect. In the ninth aspect, the plurality of avalanche photodiodes may at least include first avalanche photodiodes with a first plane area and second avalanche photodiodes with a second plane area different from the first plane area; the first avalanche photodiodes may be arranged in a lattice pattern; and the second avalanche photodiodes may be disposed at opposed corner positions of adjacent ones of the first avalanche photodiodes.

Thus, the first isolation region and the second isolation region can be terminated at each side portion of the second avalanche photodiode. Moreover, the difference in opening area between the first avalanche photodiode and the second avalanche photodiode can be used to set the sensitivities of the first avalanche photodiode and the second avalanche photodiode individually.

A tenth aspect is an embodiment of the ninth aspect. In the tenth aspect, the first plane area may be larger than the second plane area.

An eleventh aspect is an embodiment of the ninth or tenth aspect. In the eleventh aspect, each of the first avalanche photodiodes may have a planar octagonal shape, and each of the second avalanche photodiode may have a planar quadrangular shape.

As a result, the electric field can be made uniform in the first avalanche photodiodes.

A twelfth aspect is an embodiment of the first to eleventh aspects. In the twelfth aspect, the photodiode may further include a circuit region provided between the plurality of avalanche photodiodes, and a fourth isolation region that is depleted and electrically separates each of the avalanche photodiodes from the circuit region. At least one of the first isolation region, the second isolation region, the third isolation region, or the fourth isolation region may be terminated at a third connection portion at which at least two of the first isolation region, the second isolation region, the third isolation region, and the fourth isolation region are connected.

According to this configuration, even in the case of the configuration in which the circuit region is provided between the avalanche photodiodes, at least one of the isolation regions can be terminated.

A thirteenth aspect is an embodiment of the twelfth aspect. In the thirteenth aspect, the circuit region may be disposed between two fourth isolation regions, and the circuit region and the fourth isolation regions may be linearly disposed in the first main surface.

A fourteenth aspect is an embodiment of the twelfth or thirteenth aspect. In the fourteenth aspect, the photodiode may further include a fifth isolation region that is depleted, electrically separates each of the avalanche photodiodes from the circuit region, and is provided in a direction different from a direction of the fourth isolation region. At least one of the fourth isolation region or the fifth isolation region may be terminated at a fourth connection portion at which the fourth isolation region and the fifth isolation region are connected.

The configuration according to the fourteenth aspect is a configuration in which the second avalanche photodiode of the ninth aspect is replaced with the circuit region, and the fourth isolation region and the fifth isolation region can be terminated at each side portion of the circuit region.

A fifteenth aspect is an embodiment of the first to eleventh aspects. In the fifteenth aspect, the plurality of avalanche photodiodes may form a photodiode array on the first main surface, and the photosensor may further include: a terminal portion that is provided on the first main surface and made of a semiconductor surrounding the photodiode array; a sixth isolation region that is depleted and electrically separates the terminal portion from the photodiode array; and a seventh isolation region that is depleted, electrically separates the terminal portion from the photodiode array, and is provided in a direction different from a direction of the sixth isolation region. At least one of the first isolation region, the second isolation region, the third isolation region, the sixth isolation region, or the seventh isolation region may be terminated at a fifth connection portion at which at least two of the first isolation region, the second isolation region, the third isolation region, the sixth isolation region, and the seventh isolation region are connected.

According to this configuration, at least one of the first to third, sixth, and seventh isolation regions can be terminated in the fifth connection portion at which at least two of the first to third, sixth, and seventh isolation regions are connected. In addition, generation of a high electric field can be avoided by the terminal portion that is an array end surrounding the photodiode array.

A sixteenth aspect is an embodiment of the twelfth to fourteenth aspects. In the sixteenth aspect, the plurality of avalanche photodiodes may form a photodiode array on the first main surface, and the photosensor further may include: a terminal portion that is provided on the first main surface and made of a semiconductor surrounding the photodiode array; a sixth isolation region that is depleted and electrically separates at least either the terminal portion and the photodiode array from each other, or the terminal portion and the circuit region from each other; and a seventh isolation region that is depleted, electrically separates at least either the terminal portion and the photodiode array from each other, or the terminal portion and the circuit region from each other, and is provided in a direction different from a direction of the sixth isolation region. At least one of the first isolation region, the second isolation region, the third isolation region, the fourth isolation region, the fifth isolation region, the sixth isolation region, or the seventh isolation region is terminated at a sixth connection portion at which at least two of the first isolation region, the second isolation region, the third isolation region, the fourth isolation region, the fifth isolation region, the sixth isolation region, and the seventh isolation region are connected.

According to this configuration, at least one of the first to seventh isolation regions can be terminated in the sixth connection portion at which at least two of the first to seventh isolation regions are connected. In addition, generation of a high electric field can be avoided by the terminal portion that is an array end surrounding the photodiode array.

In the present specification, when a semiconductor substrate is used as reference, the side on which a first main surface is provided is referred to as "upper (above)," and the side on which a second main surface is provided is referred to as "lower (below)." Furthermore, the terms "upper (above)" and "lower (below)" are used not only in a case where two components are spaced apart from each other and another component is interposed between the two components, but also in a case where the two components are in contact with each other.

In addition, in the present specification, the term "plan view" means viewing from above in the normal direction of a light receiving surface of a photoelectric conversion layer.

In the present specification, the impurity concentration refers to an effective impurity concentration, and in a case where both impurities of different conductivity types are present in the same region, the impurity concentration refers to the difference therebetween.

First Embodiment

A first embodiment will be described with reference to the drawings.

Figure 2:
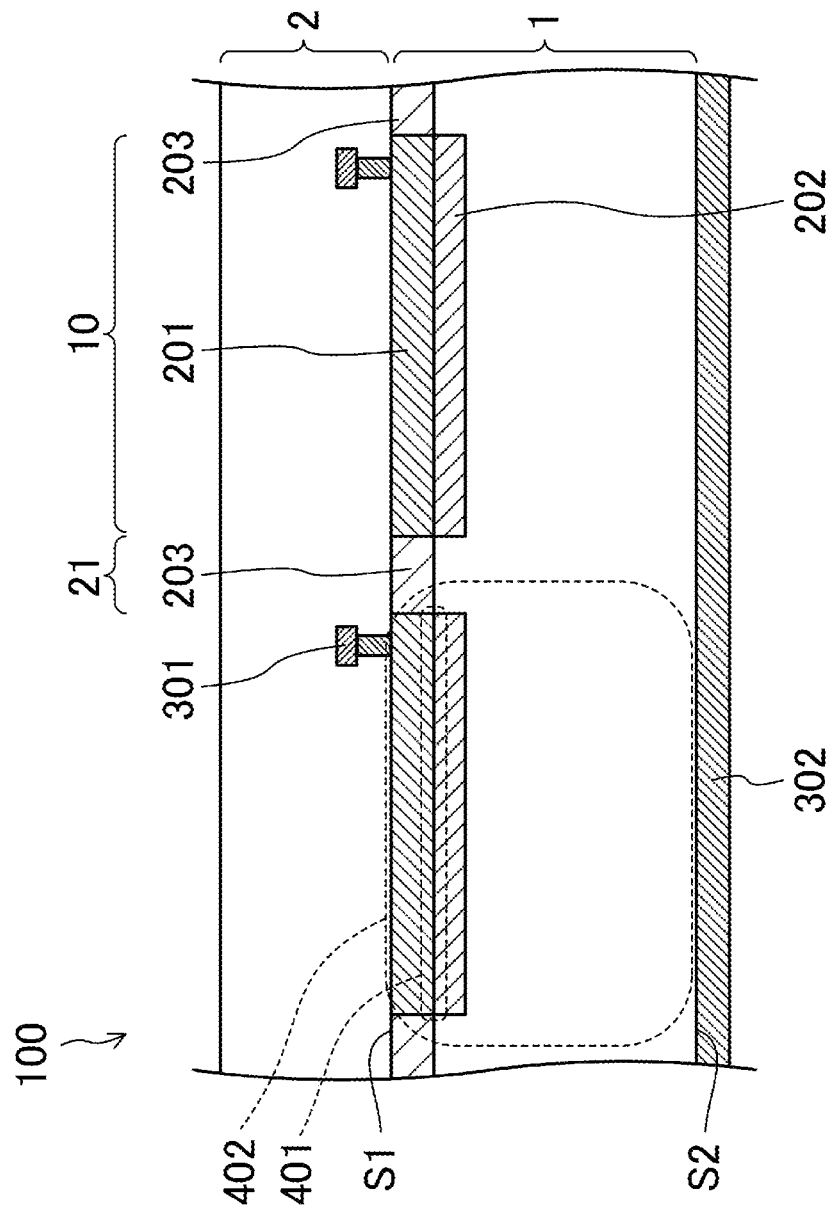
FIG. 2 is a cross-sectional view taken along line II-II in FIG. 1.

FIG. 1 illustrates an example of a partial planar configuration of an avalanche photodiode array that constitutes a photosensor according to a first embodiment. FIG. 2 illustrates a cross-sectional configuration taken along line II-II in FIG. 1.

As illustrated in FIG. 1, a photosensor 100 according to the present embodiment includes a photodiode array in which a plurality of avalanche photodiodes (APD) 10 are arranged in a matrix. The individual APDs 10 are electrically separated by a first isolation region 21 that isolates the APD 10 in a vertical direction (a first direction) and a second isolation region 22 that isolates the APD 10 in a lateral direction (a second direction). The first isolation region 21 and the second isolation region 22 are connected, for example, at a first connection portion 31. In the present specification, an end portion of the first isolation region 21 is connected to side (a side portion) of the second isolation region 22 in the first connection portion 31, so that the first isolation region 21 terminates at the first connection portion 31. Hereinafter, a portion other than the connection portion in the isolation region is referred to as "side portion."

As illustrated in FIG. 1, in a case where the individual APDs 10 are arranged in a staggered manner, at least one of the first isolation region 21 or the second isolation region 22 terminates at the first connection portion 31. Accordingly, the arrangement of the APD array may be a staggered arrangement. "Staggered arrangement" means that the arrangement of the APDs 10 is shifted for each row or each column, and the first isolation regions 21 are not arranged in a lattice pattern. FIG. 1 illustrates an example in which the arrangement of the APDs 10 is shifted by a half cycle for each row (or each column) as the staggered arrangement, but the shift amount in this case is arbitrary. However, it is desirable to provide a side portion with a length of 0.3 μm or more between adjacent connection portions 31 so that the adjacent connection portions 31 do not affect each other. The structure and the plane area of each APD 10 are arbitrary, and the plane area of the APD 10 may be different for each row or each column, for example.

As illustrated in FIG. 2, the photosensor 100 according to the present embodiment includes a semiconductor substrate 1 and a wiring layer 2 provided on the semiconductor substrate 1. Here, among the main surfaces of the semiconductor substrate 1, the main surface on a side of the wiring layer 2 is defined as "first main surface S1," and the main surface opposite to the first main surface S1, that is, the main surface on the other side is defined as "second main surface S2."

In the present specification, unless otherwise specified, in the semiconductor substrate 1, approaching the lower portion of FIG. 2 is referred to as "depth direction," the side of the first main surface S1 is referred to as "shallow," and the side of the second main surface S2 is referred to as "deep." In addition, the lateral direction in FIG. 2 is referred to as "horizontal direction."

The wiring layer 2 includes a first contact 301. The semiconductor substrate 1 includes a first semiconductor layer 201 of a first conductivity type (for example, an n-type) and a second semiconductor layer 202 of a second conductivity type (for example, a p-type) that has a polarity different from that of the first conductivity type. The second semiconductor layer 202 is deeper than the first semiconductor layer 201. The first isolation region 21 in the semiconductor substrate 1 includes a third semiconductor layer 203. The conductivity types may be the opposite of the above, that is, the first conductivity type may be the p-type and the second conductivity type may be the n-type.

Referring to FIG. 2, the second semiconductor layer 202 is not illustrated in the first isolation region 21. However, the second semiconductor layer 202 may be expanded in the horizontal direction, and a part thereof may be included in the isolation region 21.

The first contact 301 is provided on the first main surface S1 of the semiconductor substrate 1. A second contact 302 is provided on the second main surface S2 of the semiconductor substrate 1. Each of the contacts 301 and 302 is made of a conductor such as metal, a semiconductor containing high concentration impurities, or the like. The conductivity type of the impurity in the case of the semiconductor is not particularly limited.

In one preferred embodiment, at least a part of the semiconductor substrate 1 is of the second conductivity type (for example, the p-type), and is formed by epitaxial growth. In this case, the second semiconductor layer 202 may also be formed by epitaxial growth. In this way, the second semiconductor layer 202 is formed on the entire surface of the semiconductor substrate 1; thus, the second semiconductor layer 202 is formed in the first isolation region 21, as well. The semiconductor substrate 1 may be a p-type single crystal silicon substrate. As described later, the second semiconductor layer 202 may be a p-type epitaxial layer formed on the upper surface of the semiconductor substrate 1.

In the photosensor 100 according to the present embodiment, a multiplication region 401 is formed between the first semiconductor layer 201 and the second semiconductor layer 202 by applying a reverse bias to the first semiconductor layer 201 and the second semiconductor layer 202. The charge passing through the multiplication region 401 is multiplied by the avalanche effect. A predetermined voltage is applied from the first contact 301 to the first semiconductor layer 201. A predetermined voltage is applied from the second contact 302 to the second semiconductor layer 202 via the semiconductor substrate 1. Here, "application of voltage" does not necessarily mean that the voltages of the contacts 301 and 302 and the voltages of the semiconductor layers 201 and 202 need to match each other. For example, in the case of the configuration of FIG. 2, when the impurity concentration of the semiconductor substrate 1 is low, the semiconductor substrate 1 is depleted to cause a voltage drop, and the voltage of the second contact 302 and the voltage of the second semiconductor layer 202 are different from each other. This case is also included in the scope of the present disclosure.

Furthermore, in the present specification, the avalanche multiplication includes both linear multiplication and Geiger multiplication, and in particular, in the case of a Geiger multiplication mode, a quenching element for stopping the Geiger multiplication may be provided. As the quenching element in this case, resistance, capacitance, a transistor, or the like can be used, and the type of the element is not limited. However, the linear multiplication mode in the present specification refers to "an operation mode of an APD in which the reverse bias applied to the APD is equal to or less than an avalanche breakdown voltage and charge multiplication occurs due to impact ionization." Furthermore, the Geiger multiplication mode refers to "an operation mode of an APD in which the APD is operated by receiving a reverse bias that is equal to more than an avalanche breakdown voltage at least temporarily."

In particular, the configuration according to the present disclosure can be used for an element such as a multi-pixel photon counter (MPPC) or a single photon avalanche diode (SPAD).

The magnitude of the electric field in the multiplication region 401 may be, for example, $3 \times 10^5$ V/cm to $5 \times 10^5$ V/cm, and the impurity concentration of the first semiconductor layer 201 and the second semiconductor layer 202 is, for example, $10^{16}$ cm$^{-3}$ to $10^{20}$ cm$^{-3}$.

Furthermore, in FIG. 2, the first semiconductor layer 201 and the second semiconductor layer 202 are illustrated adjacent to each other in the depth direction. The configuration is not limited thereto, and the semiconductor substrate 1 may be included between the first semiconductor layer 201 and the second semiconductor layer 202. In this case, a photoelectric conversion region 402 is the entire region of the semiconductor substrate 1. However, there is a case where charges that do not pass through the multiplication region 401, such as charges generated in the isolation regions 21 and 22, cannot be detected.

The first conductivity type may be a p-type and the second conductivity type may be an n-type. Furthermore, in a more preferred embodiment, the first conductivity type is an n-type and the second conductivity type is a p-type.

In the present embodiment, the third semiconductor layer 203 constituting the individual isolation regions 21 and 22 may be depleted. As a result, for example, since the electric field of each of the isolation regions 21 and 22 is reduced, the width of each of the isolation regions 21 and 22 can be reduced accordingly. As described above, by reducing the widths of the isolation regions 21 and 22, the area of the multiplication region 401 is enlarged, so that an aperture ratio can be improved. In addition, miniaturization can be performed while maintaining a high aperture ratio. The conductivity type of the third semiconductor layer 203 may be the first conductivity type or the second conductivity type. Further, a contact, a trench, and the like do not need to be disposed in the first isolation region 21 and the second isolation region 22.

In the structure according to the present embodiment, in a case where the isolation regions 21 and 22 are each depleted, the potential of at least a part of the isolation regions 21 and 22 is different from the potential of the second contact 302.

The width of each of the isolation regions 21 and 22 may be, for example, 0.1 μm to 1 μm. The impurity concentration may be $10^{15}$ cm$^{-3}$ to $10^{18}$ cm$^{-3}$.

The potential barriers of the isolation regions 21 and 22 are designed so that the charge does not leak from a certain APD to an APD adjacent to the certain APD. In particular, when the APD is used in the Geiger multiplication mode, the voltage as a result of the voltage fluctuation of the APD due to the charge generated by the avalanche multiplication is equal to or more than the excess voltage to be applied to the APD. Accordingly, the size of the potential barriers of the isolation regions 21 and 22 may be designed to be equal to or larger than the excess voltage at the minimum. The size of the potential barrier is typically about 0.1 V to 10 V. In the present specification, the excess voltage is "the difference between the reverse bias voltage of the APD and the avalanche breakdown voltage."

Here, (the absolute value of) the applied voltage from the second contact may be higher than (the absolute value of) the applied voltage from the first contact 301. In this way, since a high electric field is less likely to be generated in the wiring layer 2, the reliability of the device can be enhanced.

Figure 3:
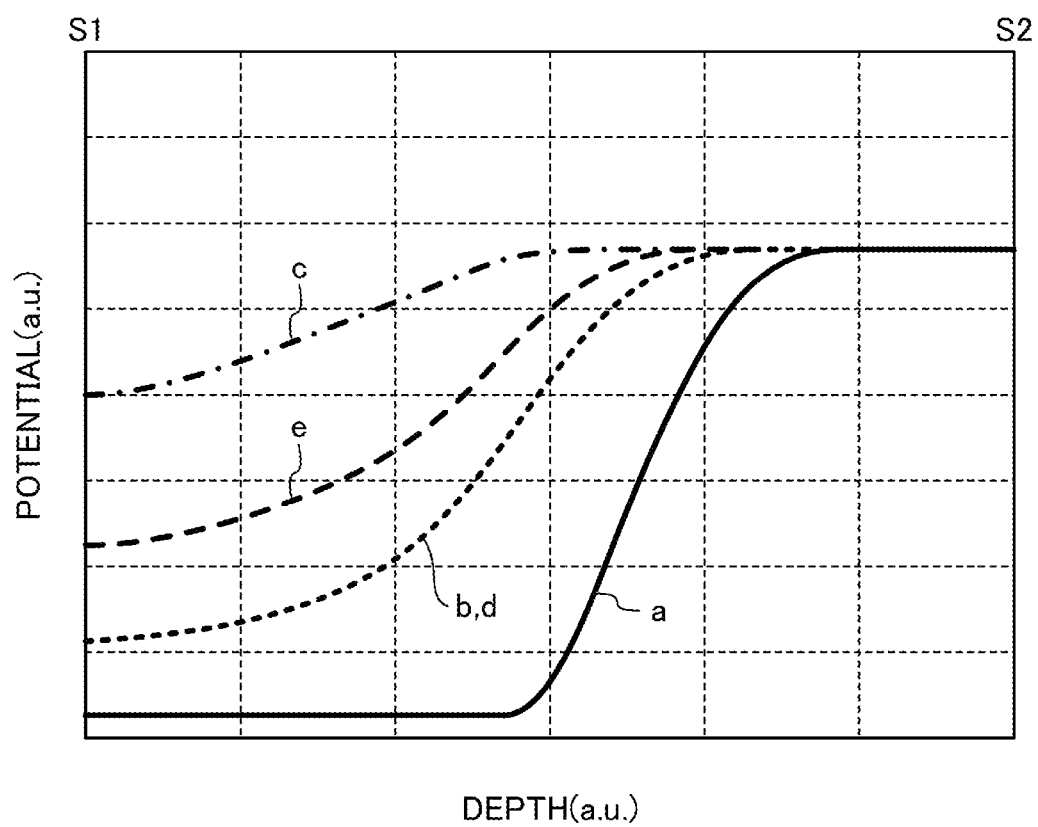
FIG. 3 is a graph illustrating an example of a result of TCAD simulation in the photosensor according to the first embodiment together with a comparative example.

FIG. 3 illustrates an example of a result of technology CAD (TCAD) simulation in the photosensor 100 according to the present embodiment. FIG. 3 also illustrates, as a comparative example, a result of the TCAD simulation in a photosensor 100A that has a configuration in which a first isolation region 21A and a second isolation region 22A intersect in a lattice pattern in an avalanche photodiode (APD).

In FIG. 3, the horizontal axis represents the depth in the semiconductor substrate 1, and the vertical axis represents the potential. In addition, the individual data illustrated in FIG. 3 indicate the potential in the depth direction at points a to e illustrated in FIGS. 1 and 4.

The individual positions on the semiconductor substrate 1 are as follows, in which a: central portion of APD, b: side portion of comparative example, c: first intersection portion 31A of comparative example, d: side portion, and e: first connection portion 31. As shown in the simulation result illustrated in FIG. 3, in the present disclosure, the potential (e) of the first connection portion 31 is lower than the potential (c) of the first intersection portion 31A in the comparative example. As a result, the electric field concentration at the first connection portion 31 is relaxed, and the isolation width of each of the isolation regions 21 and 22 can be reduced.

Figure 4:
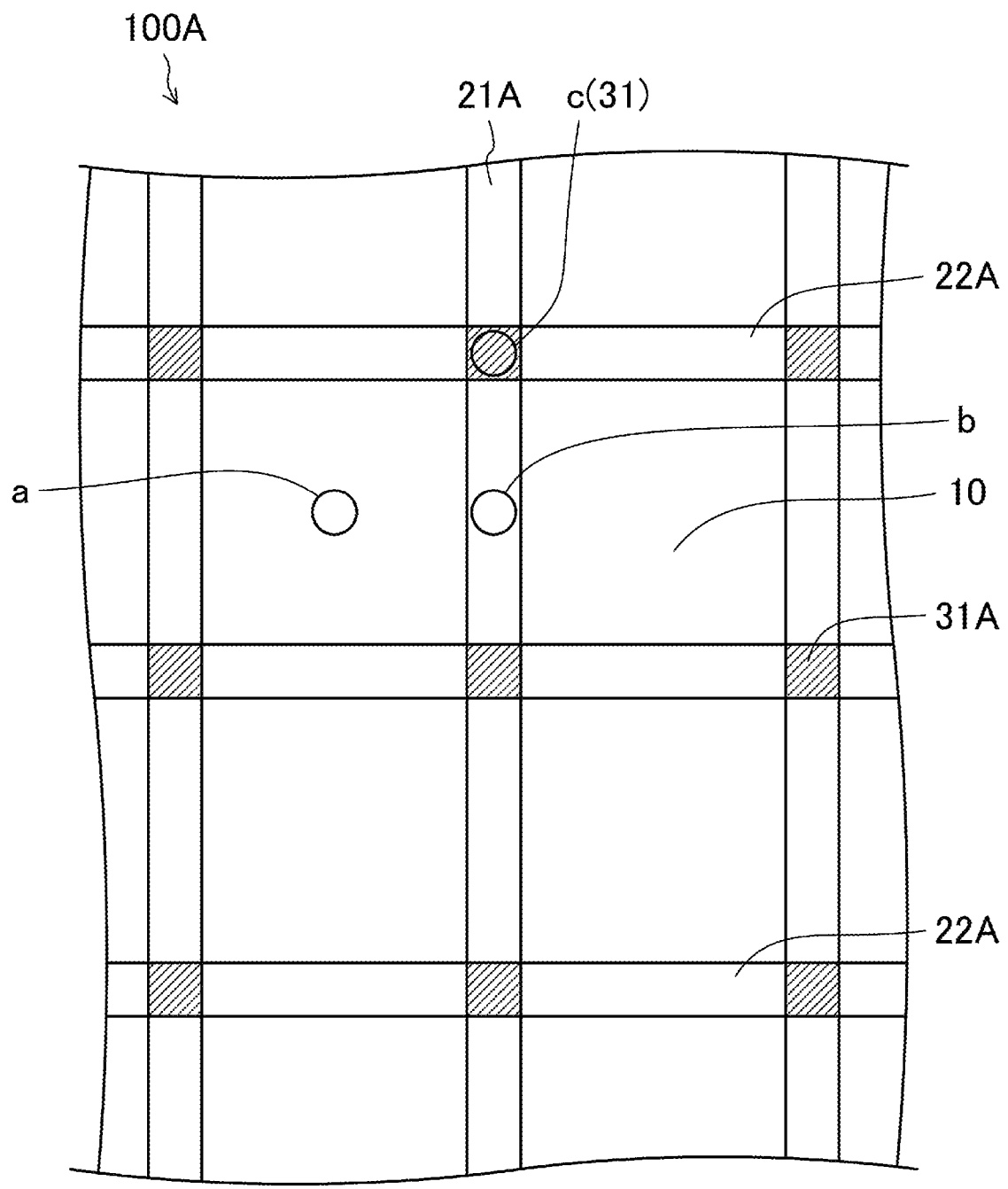
FIG. 4 is a partial plan view illustrating a part of an avalanche photodiode array in a photosensor according to the comparative example.

In the case of the comparative example, the potential (c) at the first intersection portion 31A is not very different from the potential of the second main surface S2. Accordingly, in order to make the electric field at the first intersection portion 31A equal to or less than the avalanche breakdown electric field, it is necessary to expand the widths of the isolation region regions 21A and 22A to about the width of a depletion layer in the multiplication region 401. In the example of FIG. 4, the potential (c) at the first intersection portion 31A is about 80% of the potential of the second main surface S2. Accordingly, the lower limit of the widths of the isolation regions 21A and 22A is about 80% of the width of the depletion layer of the multiplication region 401. On the other hand, in the case of the APD layout according to the present embodiment, the potential (e) of the first connection portion 31 is reduced to about 40% of the potential of the second main surface S2. Accordingly, the lower limit of the widths of the isolation regions 21 and 22 can be reduced to about 40% of the width of the depletion layer of the multiplication region 401. The width of the typical multiplication region 401 is about 0.5 μm to 2 μm. In the example illustrated in FIG. 4, the isolation width is 0.4 μm to 1.6 μm. However, in the present embodiment, the isolation width can be narrowed to 0.2 μm to 0.8 μm.

[First Modification of Layout]

Hereinafter, a first modification of the APD layout in the photosensor according to the first embodiment will be described with reference to the drawings.

Figure 5:
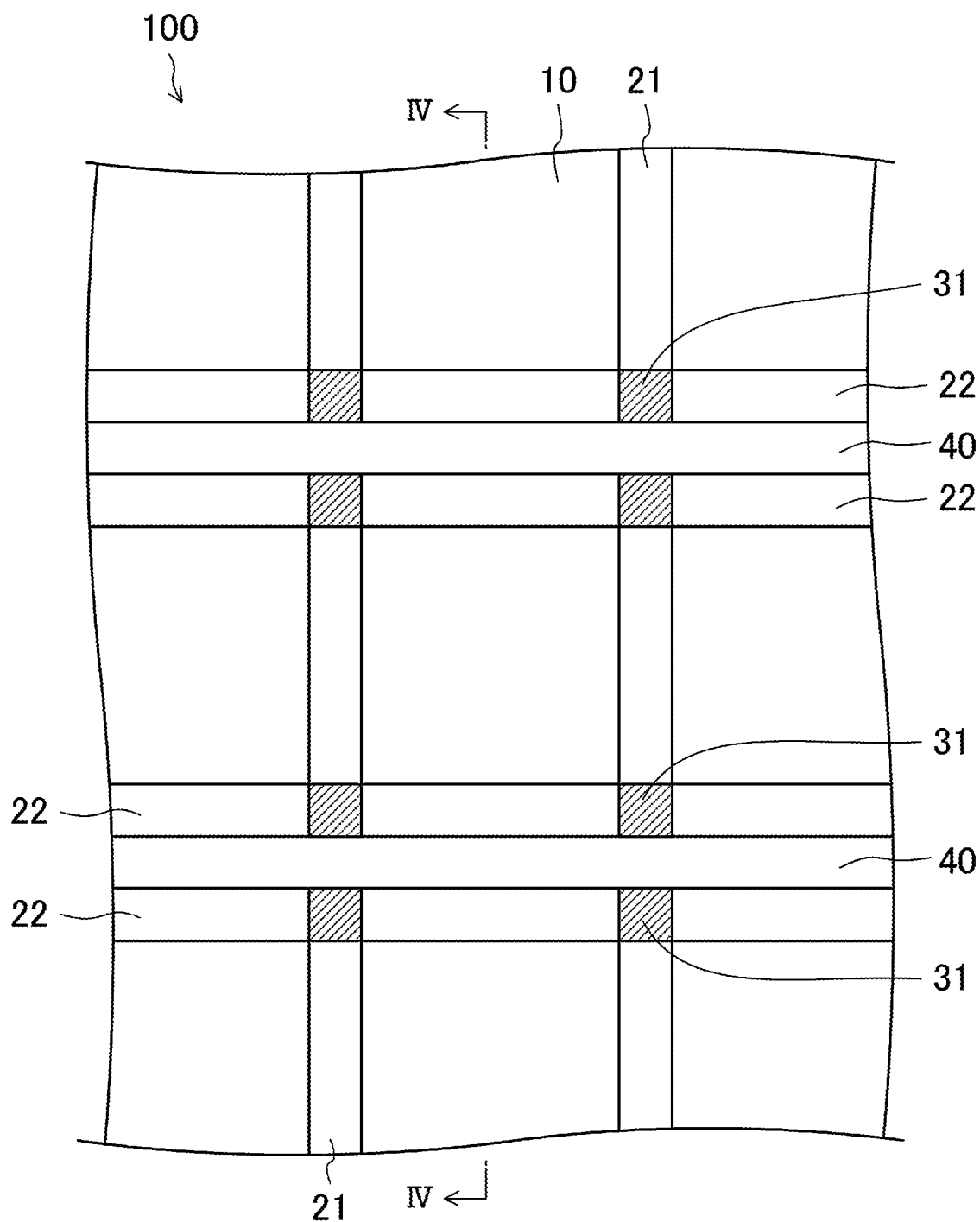
FIG. 5 is a partial plan view illustrating a first modification of an APD layout according to the first embodiment.
Figure 6:
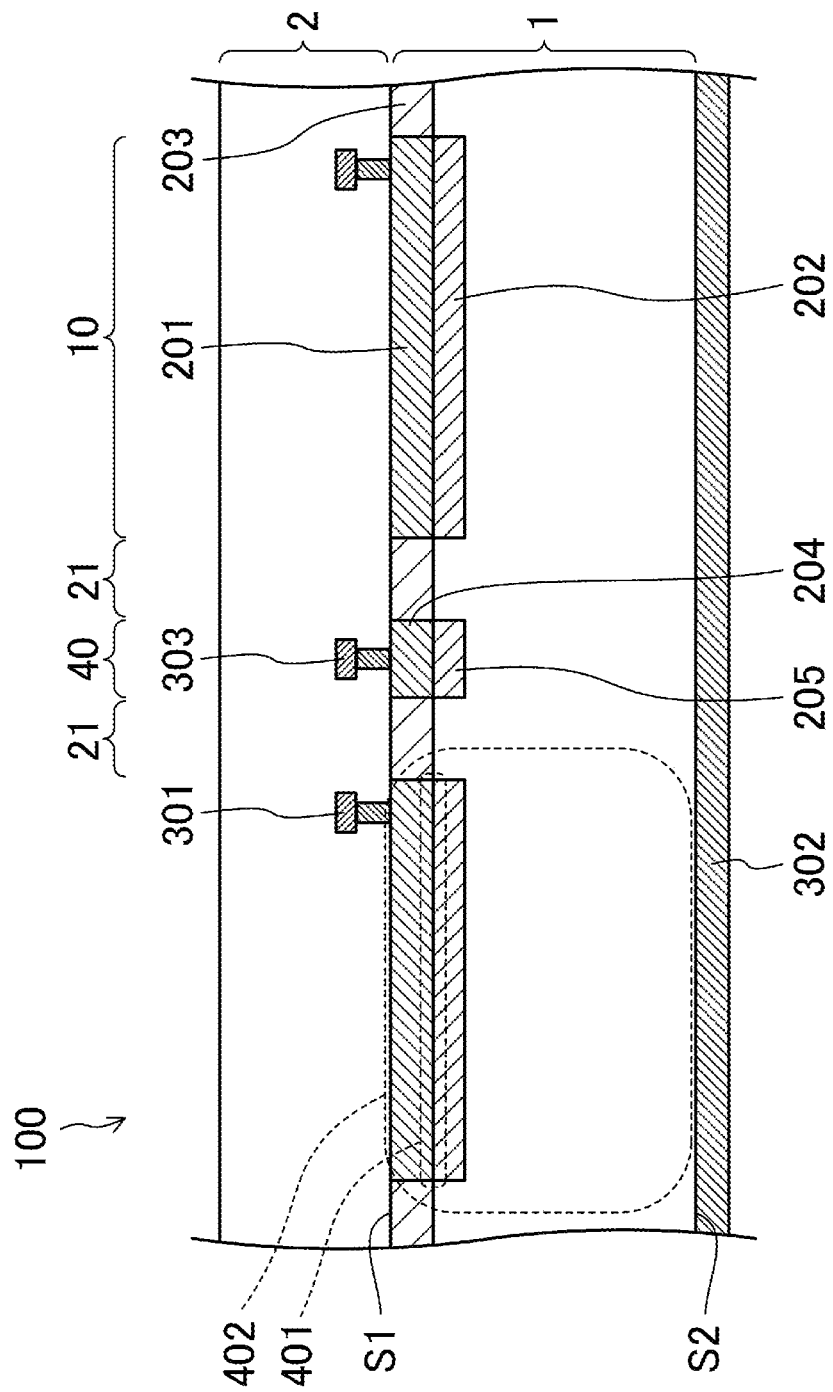
FIG. 6 is a cross-sectional view taken along line IV-IV in FIG. 5.

FIG. 5 illustrates a planar configuration of the first modification of the APD layout according to the first embodiment, and FIG. 6 illustrates a cross-sectional configuration taken along line IV-IV in FIG. 5. The same components as those illustrated in FIGS. 1 and 2 are denoted by the same reference numerals, and the description thereof will be omitted. The same holds true for the following other embodiments and modifications.

As illustrated in FIGS. 5 and 6, the photosensor 100 according to the first modification includes a voltage fixation layer 40 provided in parallel between two second isolation regions 22 on the first main surface S1 of the semiconductor substrate 1. That is, the voltage fixation layer 40 is disposed to be sandwiched between the second isolation regions 22. As illustrated in FIG. 5, the voltage fixation layer 40 may be linearly disposed in a row direction, or may be linearly disposed in a column direction. In the case of being disposed in the column direction, the voltage fixation layer 40 is disposed to be sandwiched between the two first isolation regions 21.

As described above, for example, when the voltage fixation layer 40 is disposed to be sandwiched between the two second isolation regions 22, the voltage fixation layer 40 is adjacent to the second isolation region 22 and the first connection portion 31. With this arrangement, as illustrated in FIG. 5, even when the first isolation region 21 and the second isolation region 22 are arranged in a lattice pattern, the first isolation region 21 can be terminated at the first connection portion 31.

The arrangement is not limited to the arrangement in which the first isolation region 21 and the second isolation region 22 are connected substantially orthogonally at the first connection portion 31.

As illustrated in FIG. 6, the voltage fixation layer 40 may include a fourth semiconductor layer 204 of a first conductivity type (for example, an n-type) and a fifth semiconductor layer 205 of a second conductivity type (for example, a p-type). A voltage is applied from a third contact 303 to the fourth semiconductor layer 204.

The voltage fixation layer 40 may have a configuration equivalent to that of the APD 10 in the depth direction. Accordingly, the potential of the first isolation region 21 and the potential of the second isolation region 22 can substantially match. As a result, the position dependence of the potential can be further reduced.

In addition, the voltage fixation layer 40 may be used for detecting an optical signal as, for example, an avalanche photodiode (APD) with a different plane area (a different opening area) from the APD 10. As a result, two types of APDs with different opening areas can be provided on the same semiconductor substrate 1, thereby making it possible to improve the dynamic range.

Figure 5A:
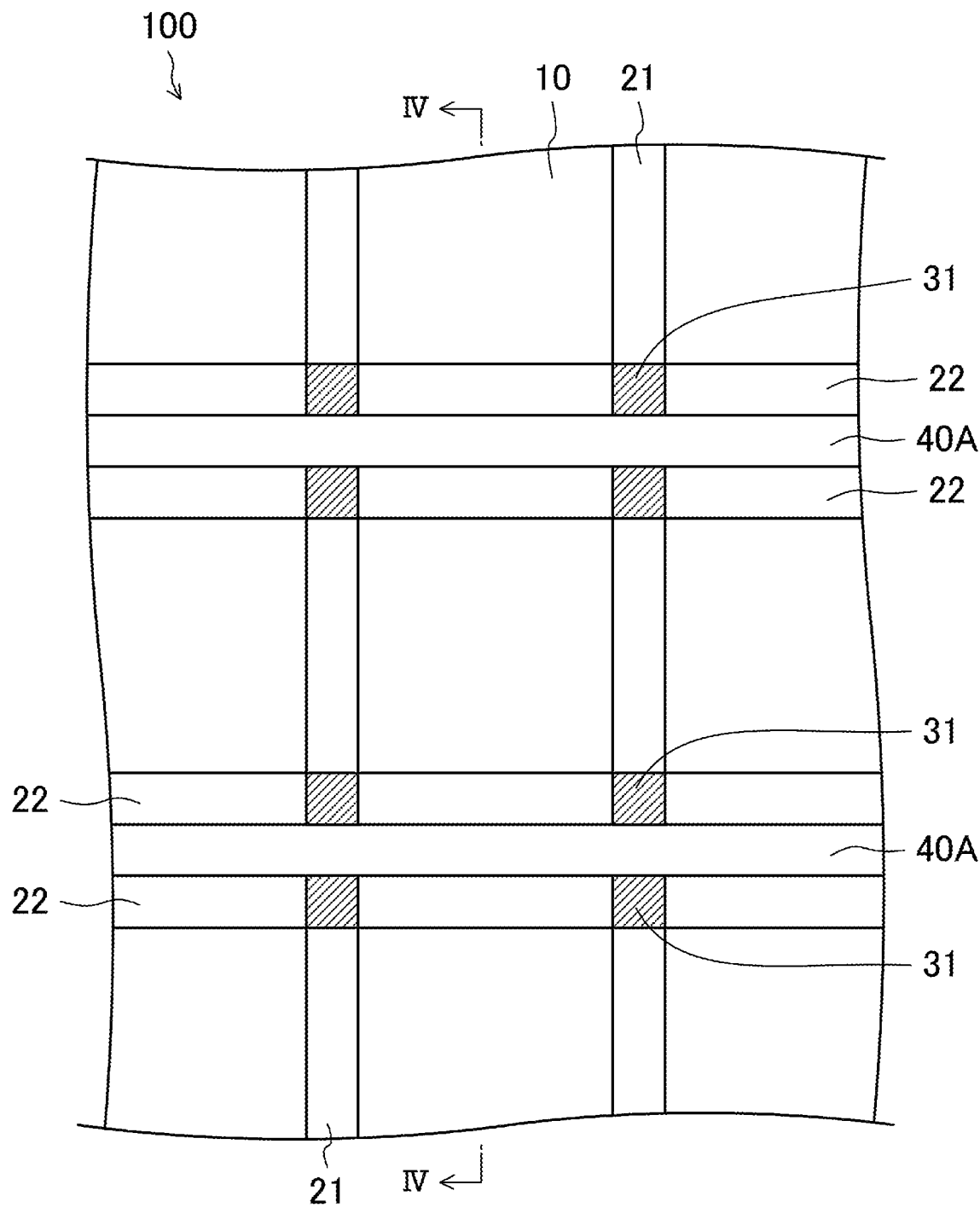
FIG. 5A is a partial plan view illustrating a first modification of the configuration in FIG. 5.

Furthermore, as a modification of the configuration, as illustrated in FIGS. 5A and 6A, a voltage fixation layer 40A may be configured to include only the fourth semiconductor layer 204 without the fifth semiconductor layer 205.

[Second Modification of Layout]

Hereinafter, a second modification of the APD layout according to the first embodiment will be described with reference to the drawings.

Figure 7:
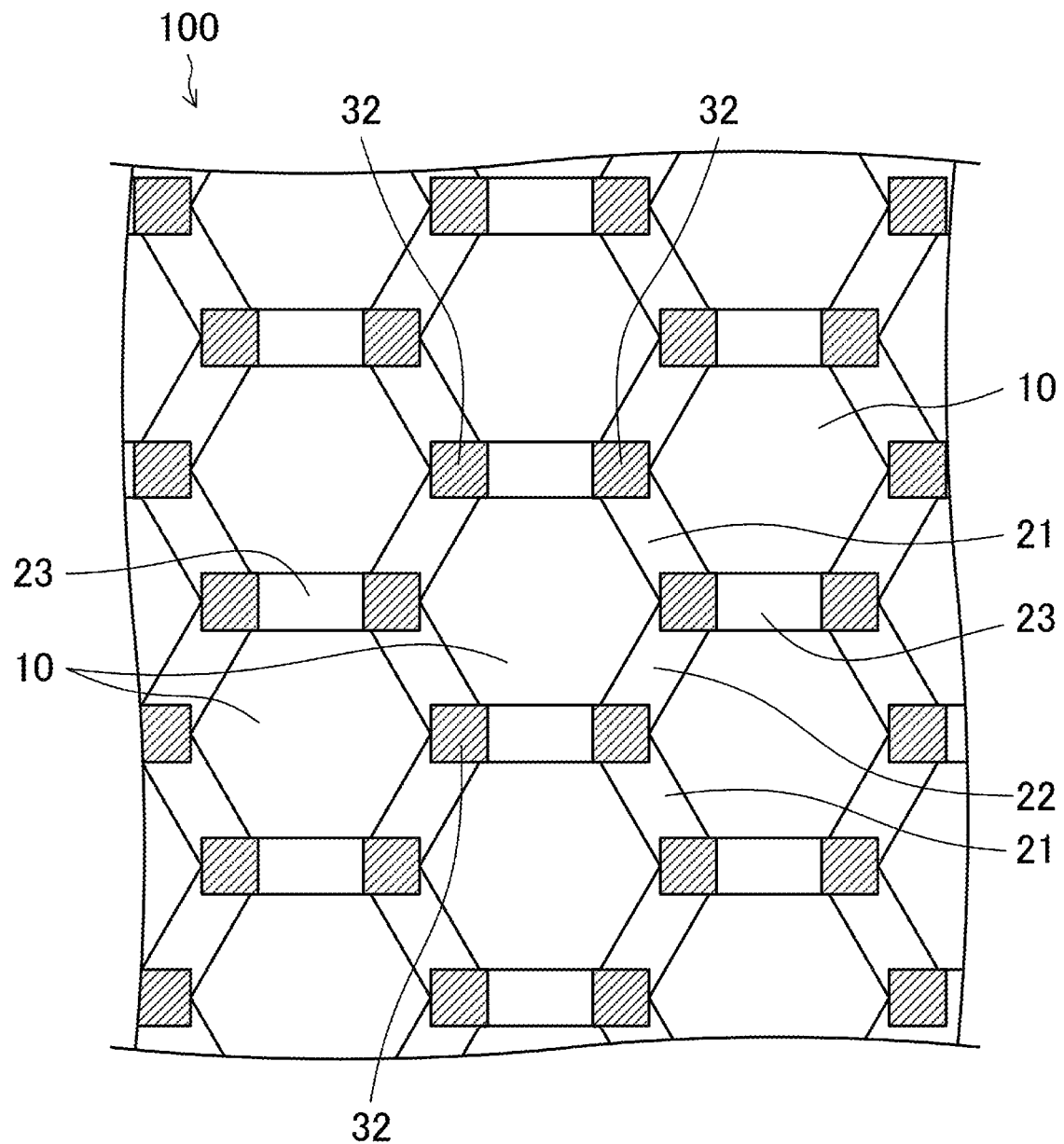
FIG. 7 is a partial plan view illustrating a second modification of the APD layout according to the first embodiment.

FIG. 7 illustrates a planar configuration of the second modification of the APD layout.

As illustrated in FIG. 7, the avalanche photodiode (APD) 10 according to the second modification may have a planar hexagonal shape. The first isolation region 21, the second isolation region 22, and a third isolation region 23 are arranged in three different directions in the first main surface S1. In the case of the planar hexagonal shape, the directions are shifted from each other by approximately 120°.

With this arrangement, even when the planar shape of each APD 10 is a polygon (here, a hexagon) having more sides than a quadrangle, each of the first isolation region 21, the second isolation region 22, and the third isolation region 23 terminates at a second connection portion 32 at which the respective isolation regions 21, 22, and 23 are connected.

[Third Modification of Layout]

Hereinafter, a third modification of the APD layout according to the first embodiment will be described with reference to the drawings.

Figure 8:
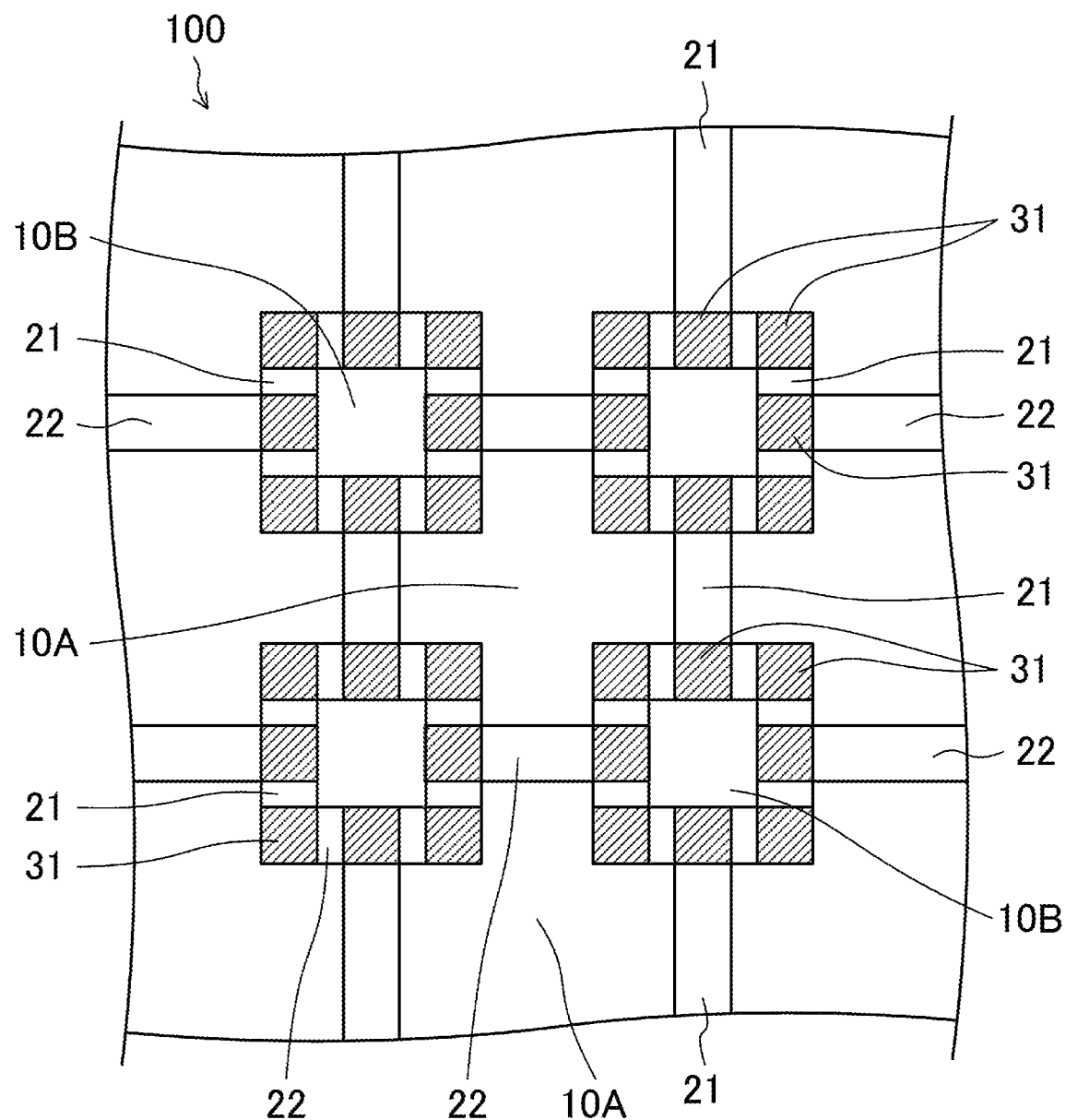
FIG. 8 is a partial plan view illustrating a third modification of the APD layout according to the first embodiment.

FIG. 8 illustrates a planar configuration of the third modification of the APD layout.

As illustrated in FIG. 8, the photosensor 100 according to the third modification includes a first avalanche photodiode (APD) 10A and a second avalanche photodiode (APD) 10B that have different plane areas.

The first APDs 10A are arranged in a lattice pattern. The second APDs 10B are disposed at opposed corner positions of the first APDs 10A adjacent to each other. As a result, the first isolation region 21 and the second isolation region 22 terminate at the first intersection portion 31. Therefore, the position dependence of the potential in each of the isolation regions 21 and 22 can be reduced.

In this case, the plane area of the first APD 10A is larger than the plane area of the second APD 10B. Accordingly, the first APD 10A with a larger plane area can be designed with relatively high sensitivity, and thus it is more effective in a relatively dark place. On the other hand, the second APD 10B with a smaller plane area can be designed with relatively low sensitivity, and thus it is more effective in a relatively bright place.

As described above, according to the third modification, the dynamic range at the time of light detection as the photosensor 100 can be expanded using a signal of the first APD 10A and a signal of the second APD 10B. In this case, a side portion with a length of 0.3 µm or more may be provided between the connection portions 31 adjacent to each other.

[Fourth Modification of Layout]

Hereinafter, a fourth modification of the APD layout according to the first embodiment will be described with reference to the drawings.

Figure 9:
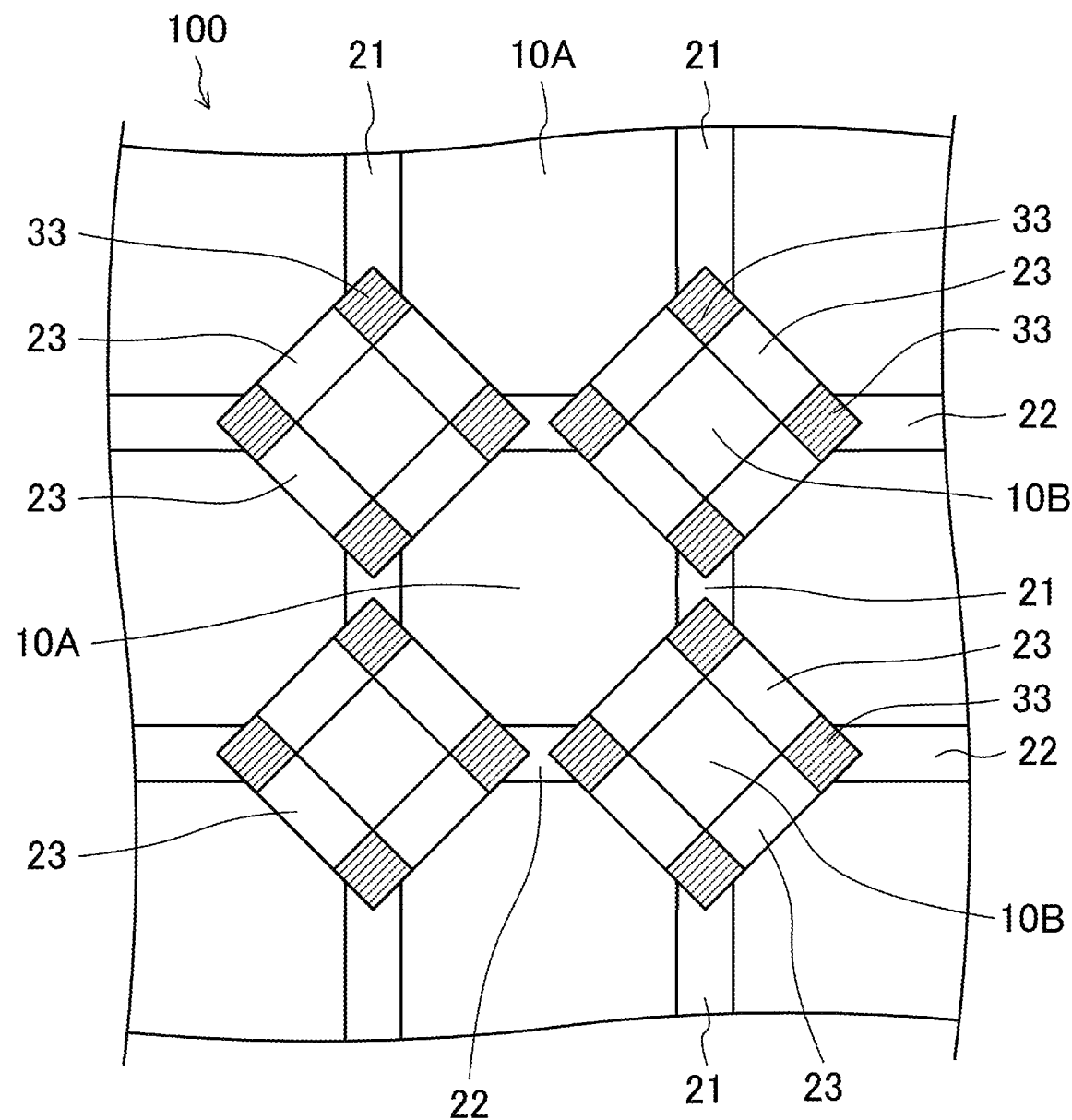
FIG. 9 is a partial plan view illustrating a fourth modification of the APD layout according to the first embodiment.

FIG. 9 illustrates a planar configuration of the fourth modification of the APD layout.

As illustrated in FIG. 9, the photosensor 100 according to the fourth modification includes the first avalanche photodiode (APD) 10A and the second avalanche photodiode (APD) 10B that have different plane areas.

In the APD layout according to the fourth modification, the second APD 10B that is a plane quadrangle surrounded by the third isolation regions 23 orthogonal to each other is disposed to be rotated by 45° with respect to each side portion of the first APD 10A. Here, the planar shape of the first APD 10A may be an octagon.

As a result, the first isolation region 21 and the third isolation region 23 are terminated at the third connection portion 33 at which the first isolation region 21 and the third isolation region 23 are connected, and the second isolation region 22 and the third isolation region 23 are terminated at the third connection portion 33 at which the second isolation region 22 and the third isolation region 23 are connected.

Therefore, the electric fields in the first APD 10A and the second APD 10B can be uniform.

Furthermore, also in the fourth modification, the dynamic range at the time of light detection as a photosensor can be expanded by the difference in magnitude between the plane area of the first APD 10A and the plane area of the second APD 10B.

Second Embodiment

Hereinafter, a second embodiment will be described with reference to the drawings.

In the second embodiment, the avalanche photodiode in the photosensor 100 includes a pixel circuit.

Figure 10:
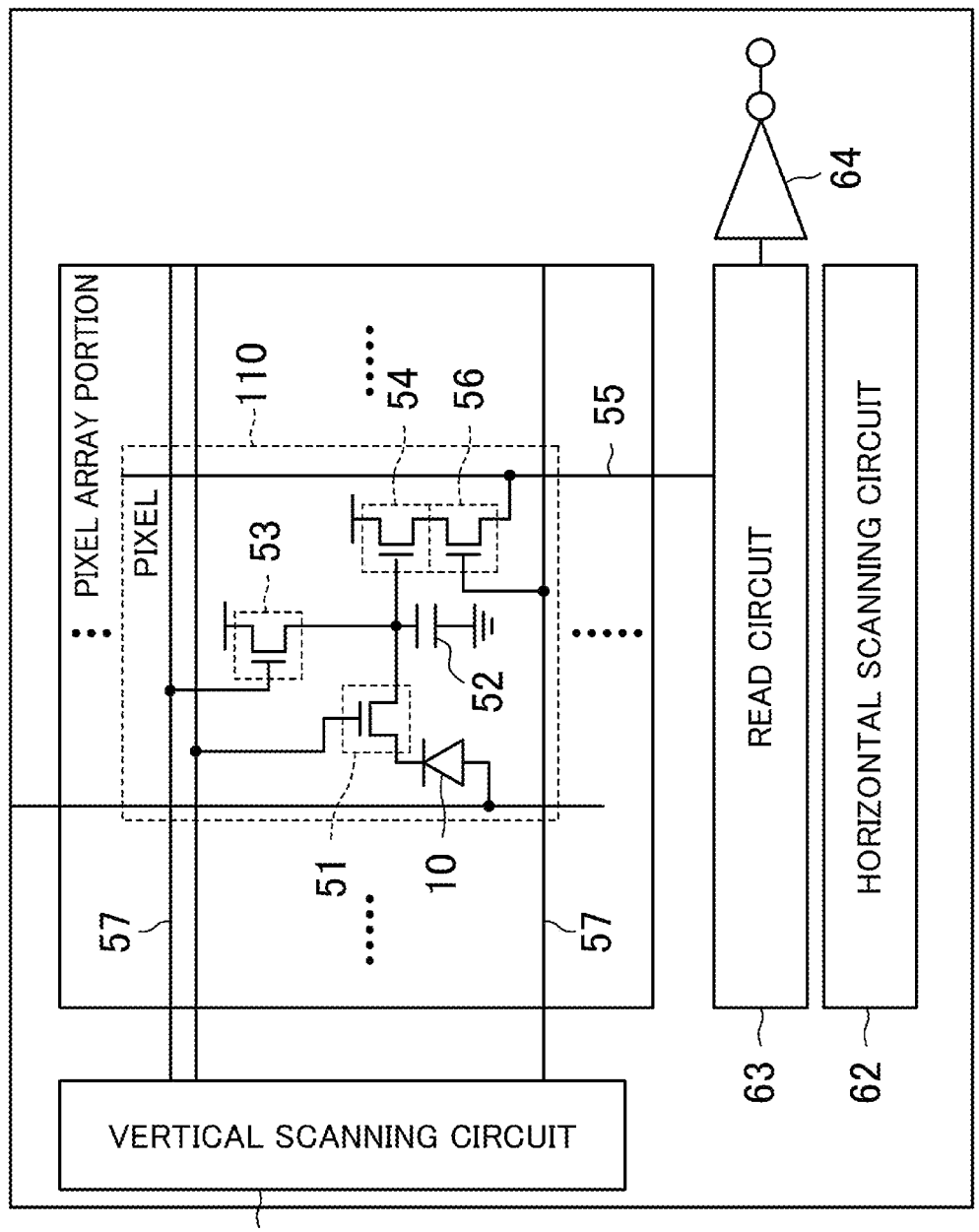
FIG. 10 is a circuit diagram illustrating a pixel circuit of a photosensor according to a second embodiment.

FIG. 10 illustrates an example of a pixel circuit of the photosensor 100 according to the second embodiment. As illustrated in FIG. 10, the photosensor 100 includes a pixel 110, a vertical scanning circuit 61, a horizontal scanning circuit 62, a read circuit 63, and a buffer amplifier 64.

The pixel 110 includes the avalanche photodiode (APD) 10, a transfer transistor 51 that transfers the charge of the APD 10, a floating diffusion capacitance (floating diffusion) 52, a reset transistor 53 that resets the charge of the floating diffusion capacitance 52, a source follower transistor 54 that amplifies the charge accumulated in the floating diffusion capacitance 52, a vertical signal line 55, and a selection transistor 56 that transfers a signal of a selected column to the vertical signal line 55.

Specifically, the transfer transistor 51 transfers the charge output from the APD 10 to the floating diffusion capacitance 52, and the floating diffusion capacitance 52 accumulates the charge. The reset transistor 53 resets the potential of the floating diffusion capacitance 52 to a predetermined potential. A drain of the reset transistor 53 is connected to a horizontal signal line 57 connected to the vertical scanning circuit 61. In the source follower transistor 54, the potential of the floating diffusion capacitance 52 based on the amount of accumulated charges is input to the gate, and an amplified signal is output. The selection transistor 56 transfers the amplified signal output from the source follower transistor 54 to the vertical signal line 55 connected to the read circuit 63.

Figure 11:
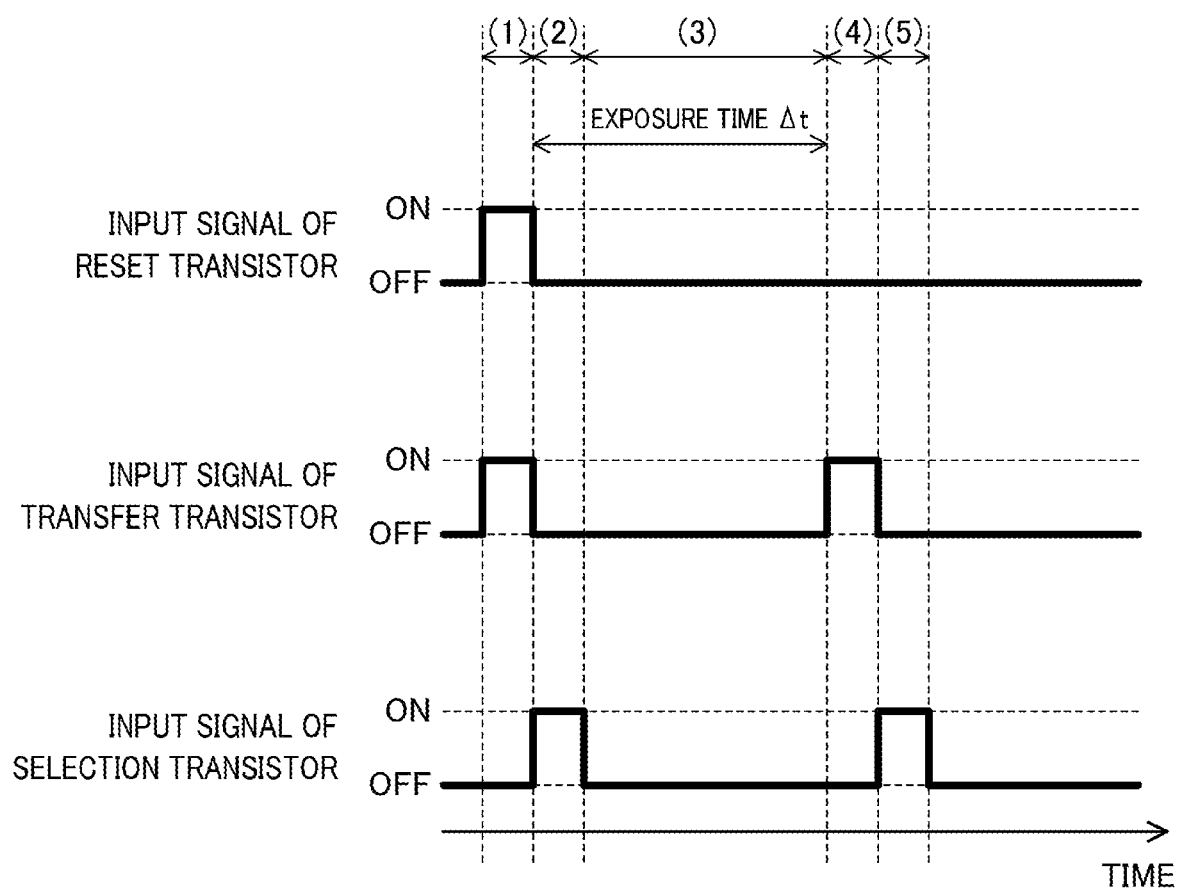
FIG. 11 is a drive timing chart of the pixel circuit according to the second embodiment.

FIG. 11 illustrates an example of a drive timing chart of the pixel circuit illustrated in FIG. 10. The upper graph is the chart of the reset transistor 53; the middle graph is the chart of the transfer transistor 51; and the lower graph is the chart of the selection transistor 56.

The transistors may be a metal oxide semiconductor field effect transistor (MOSFET), a bipolar transistor, or the like, and the type of transistors is not limited.

The drive timing chart is divided into the following five periods.

(1) Reset period: A signal is input from the vertical scanning circuit 61 to a gate of the reset transistor 53 through the horizontal signal line 57; the reset transistor 53 is turned on; and the floating diffusion capacitance 52 is reset. At the same time, a signal is input from the vertical scanning circuit 61 to a gate of the transfer transistor 51 through the horizontal signal line 57, and the avalanche photodiode (APD) 10 is reset. The drain of the reset transistor 53 is connected to the horizontal signal line 57, and when the reset transistor 53 is turned on, the potential of the floating diffusion capacitance 52 is reset to the drain potential of the reset transistor 53. In addition, since the transfer transistor 51 connected to the floating diffusion capacitance 52 is also in an on-state, the APD 10 is also reset to the drain potential of the reset transistor 53.

(2) Clamp period: The reset transistor 53 and the transfer transistor 51 are turned off, and a signal is input from the vertical scanning circuit 61 to a gate of the selection transistor 56 through the horizontal signal line 57 to turn on the selection transistor 56. The potential of a floating diffusion region immediately after the reset is transferred to the read circuit 63 via the source follower transistor 54, the selection transistor 56, and the vertical signal line 55, and is stored as a first signal in a memory (not illustrated) or the like. The memory or the like may be provided in the read circuit 63.

(3) Exposure period: When light is incident on the APD 10 after the reset period ends, electrons generated by photoelectric conversion are multiplied by the avalanche effect. As a result, the electrons are accumulated in the capacitance connected to the APD 10, specifically, the PN junction capacitance of the multiplication region 401 illustrated in FIG. 2, the PN junction capacitance of the first semiconductor layer 201 and the third semiconductor layer 203, the contact capacitance of the first contact 301, the parasitic capacitance of wires connected via the first contact 301 and the transistor 51, and the like. The exposure period is an exposure time during which light is incident on the APD 10 and electrons are accumulated, and the exposure time corresponds to the sum of the clamp period and the exposure period.

(4) Transfer period: After the exposure period ends, the transfer transistor 51 is turned on again, and the electrons accumulated in the APD 10 are transferred to the floating diffusion capacitance 52. (5) Read period: The transfer transistor 51 is turned off and the selection transistor 56 is turned on, and the potential of the floating diffusion region in a state where electrons are accumulated is transferred to the read circuit 63 as a second signal via the source follower transistor 54, the selection transistor 56, and the vertical signal line 55. A pixel signal is generated by taking the difference between the second signal and the first signal acquired during the clamp period.

Note that the pixel signal may be generated by the read circuit 63 as described above. In this case, the pixel signal is transmitted to the buffer amplifier 64 by the horizontal scanning circuit 62, and is further output to the outside. The pixel signal may be generated outside the photosensor 100.

Furthermore, a noise component such as kTC noise can be removed from the pixel signal by taking the difference between the first signal and the second signal, which makes it possible to obtain a high-quality signal.

The pixel circuit according to the present embodiment is not limited to the configuration illustrated in FIG. 10. In particular, all circuit configurations used in a single photon avalanche diode (SPAD) can be combined with the configuration according to the present embodiment.

The pixel circuit may be formed on a wafer different from the wafer including the pixel, and both wafers may be bonded by wafer bonding.

Figure 12:
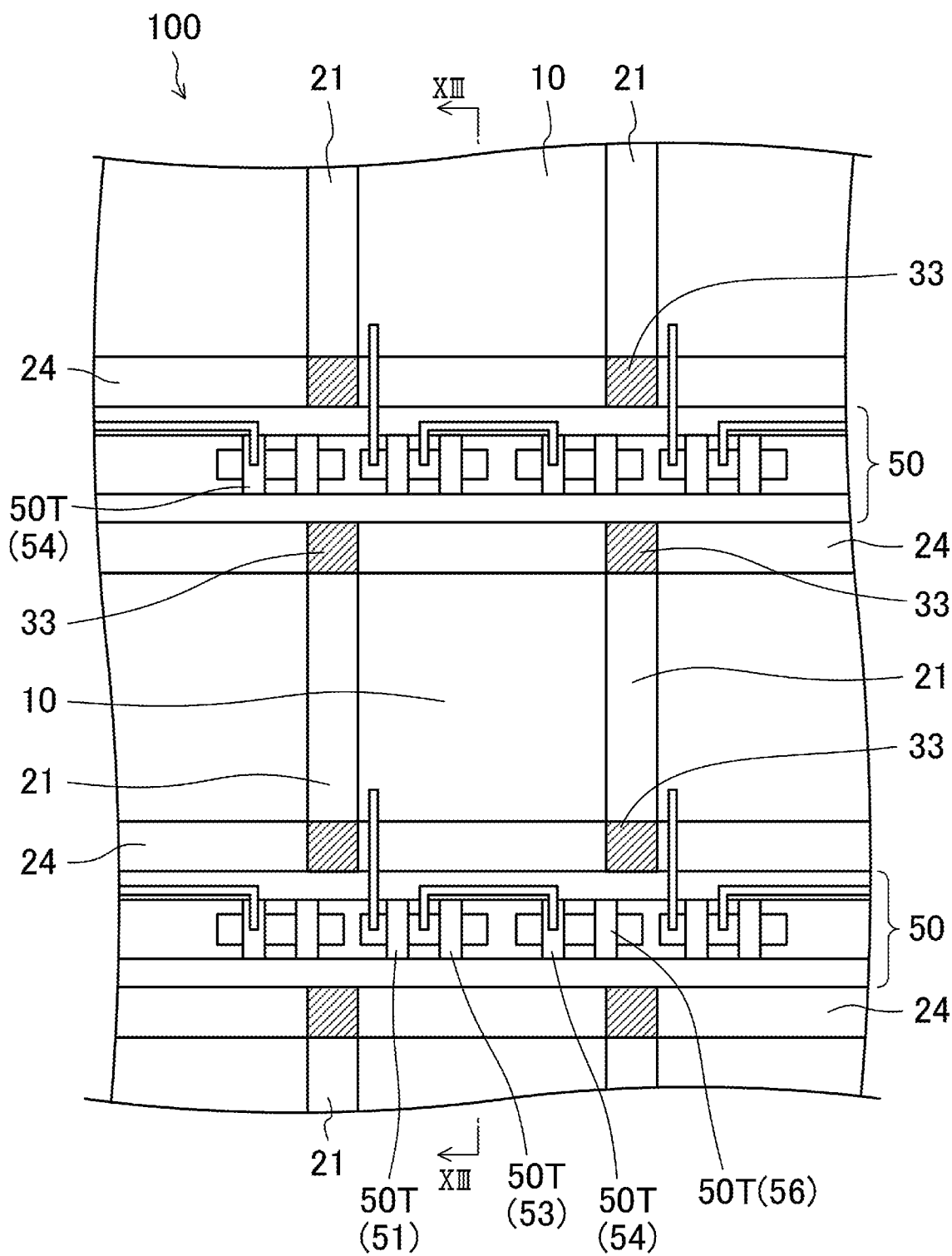
FIG. 12 is a partial plan view illustrating a part of an avalanche photodiode array in the photosensor according to the second embodiment.
Figure 13:
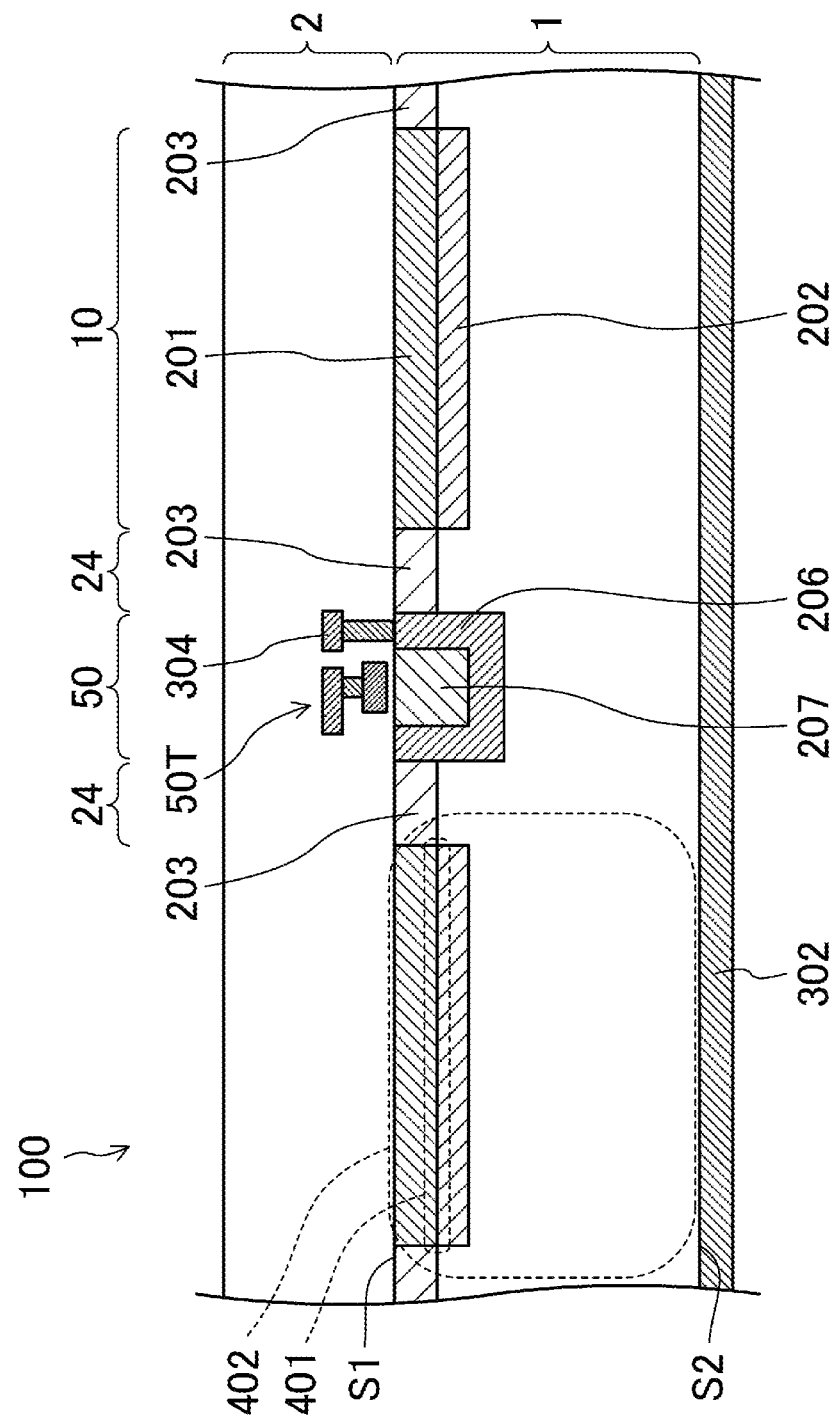
FIG. 13 is a cross-sectional view taken along line XIII-XIII in FIG. 12.

FIG. 12 illustrates an example of a layout of the photosensor according to the second embodiment. FIG. 13 illustrates a cross-sectional configuration taken along line XIII-XIII in FIG. 12.

As illustrated in FIGS. 12 and 13, in addition to the configuration described in the first embodiment, a circuit region 50 including a transistor 50T and a fourth isolation region 24 that separates the APD 10 from the circuit region 50 are included.

As illustrated in FIG. 12, the circuit region 50 is linearly disposed in the row direction, for example. Thus, the first isolation region 21 intersecting the arrangement direction of the circuit region 50 is connected to the fourth isolation region 24 adjacent to the circuit region 50 at the third connection portion 33 and is terminated. For this reason, the position dependence of the potential in the first isolation region 21 and the fourth isolation region 24 is reduced, so that the isolation width of each of the isolation regions 21 and 24 can be reduced.

The transistor 50T (e.g., the transfer transistor 51) illustrated in FIG. 10 is disposed in the circuit region 50. The circuit region 50 has a linear shape extending in the row direction in FIG. 12, but the arrangement direction of the circuit region 50 may be any direction.

As illustrated in FIG. 13, the circuit region 50 whose both sides are sandwiched by the fourth isolation regions 24 includes a first well 206 provided on the side of the first main surface S1 and a second well 207 provided inside the first well 206. The first well 206 may be of a first conductivity type (for example, an n-type), and the second well 207 may be of a second conductivity type (for example, a p-type). The transistor 50T of the first conductivity type (for example, the n-type) is provided on the second well 207.

In the example illustrated in FIG. 13, the circuit region 50 includes the first well 206 of the first conductivity type and the second well 207 of the second conductivity type, and the transistor 50T is provided on the second well 207. However, instead of two wells 206 and 207 of different conductivity types, only one first well 206 of the first conductivity type may be provided, and the transistor 50T may be of the second conductivity type.

First Modification of Second Embodiment

Hereinafter, a photosensor according to a first modification of the second embodiment will be described with reference to the drawings.

Figure 14:
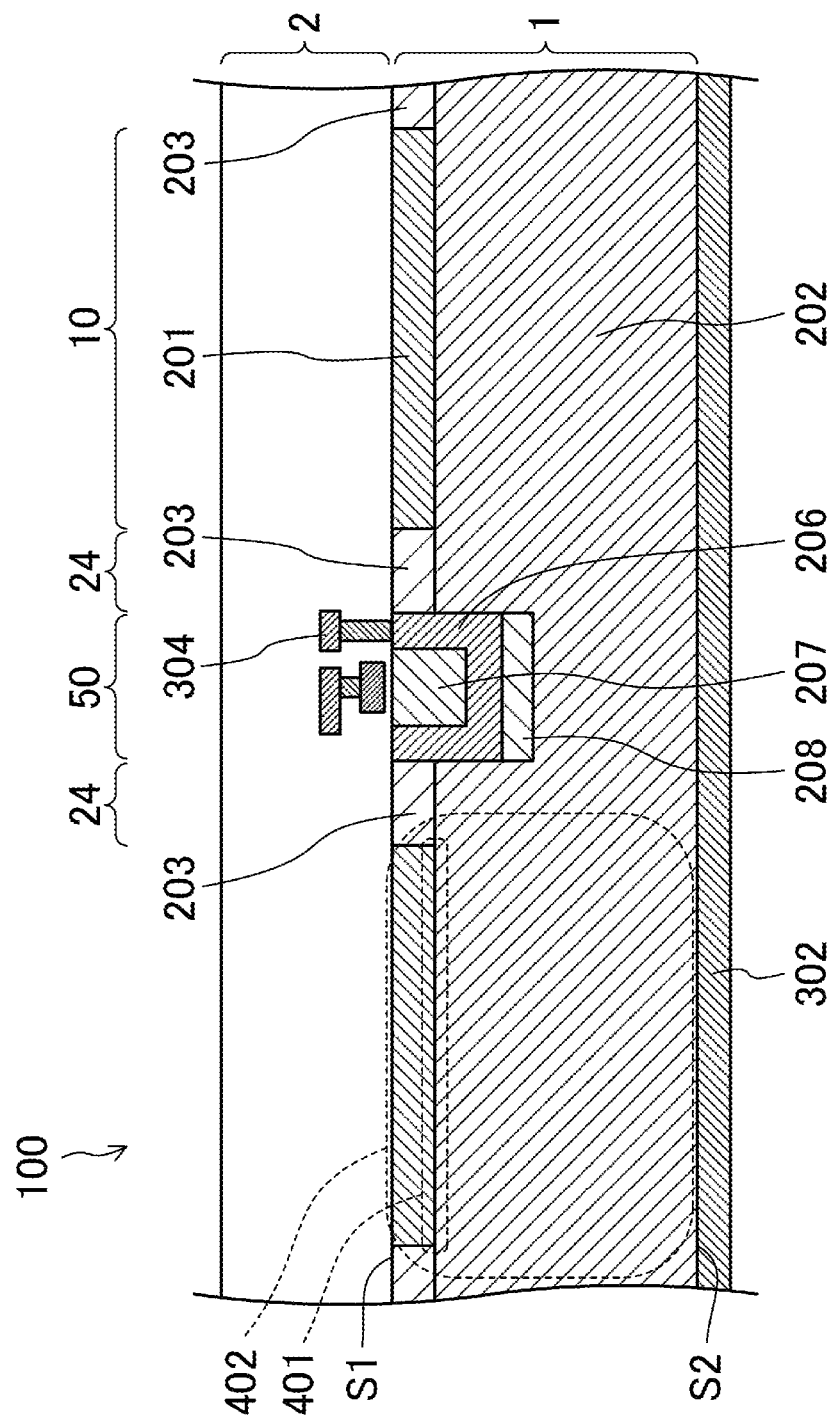
FIG. 14 is a cross-sectional view illustrating a main part including a circuit region of a photosensor according to a first modification of the second embodiment.

FIG. 14 illustrates a cross-sectional configuration of a main part including a circuit region of the photosensor according to the first modification of the second embodiment. As illustrated in FIG. 14, the second semiconductor layer 202 is formed over the entire surface in plan view from a predetermined depth in the semiconductor substrate 1 to the second main surface S2. Here, the predetermined depth is typically about 0.2 μm to 2 μm. Thus, the potentials of the first isolation region 21 and the fourth isolation region 24 can be set to be substantially the same. The isolation width of each of the isolation regions 21 and 24 can thus be further reduced.

Each circuit region 50 includes a third well 208 provided so as to be in contact with the lower side of the first well 206 of the first conductivity type (for example, the n-type). The impurity concentration of the third well 208 is set to be lower than the impurity concentrations of the first well 206 and the second semiconductor layer 202 that are adjacent to the third well 208. Thus, the electric field in the circuit region 50 according to the present modification is lower than the electric field in the avalanche photodiode (APD) 10. The conductivity type of the third well 208 is not particularly limited.

In the present modification, a concentration gradient may be applied so that the impurity concentration of the second semiconductor layer 202 gradually increases from the first main surface S1 toward the second main surface S2. According to this configuration, the charge generated in the second semiconductor layer 202 is drifted toward the multiplication region 401 by the electric field due to the impurity concentration gradient, so that the photosensitivity can be improved, and as a result, each APD 10 can be further miniaturized. In addition, the concentration gradient of the impurity concentration in the second semiconductor layer 202 may be large in a deep region of the semiconductor substrate 1 and may be small in the shallow region of the semiconductor substrate 1. Specifically, the gradient of the impurity concentration of the second semiconductor layer 202 may be steeper on the side of the second main surface S2 that is the back surface of the semiconductor substrate 1 than on the side of the first main surface S1.

As a result, the charge generated in the deep portion of the photoelectric conversion region 402 can be drifted at a higher speed, and the charge generated in the shallow region of the photoelectric conversion region 402 can be drifted at a lower speed. Therefore, the photosensitivity can be further improved, and each APD 10 can be further miniaturized.

Furthermore, in this case, an epitaxial substrate may be used as the semiconductor substrate 1, and the second semiconductor layer 202 may be formed by epitaxial growth.

Moreover, the configuration in which the concentration gradient is applied to the second semiconductor layer 202 may be applied to all the configurations described in the present specification.

[First Modification of Layout]

Hereinafter, a first modification of the APD layout in the photosensor according to the second embodiment will be described with reference to the drawings.

Figure 15:
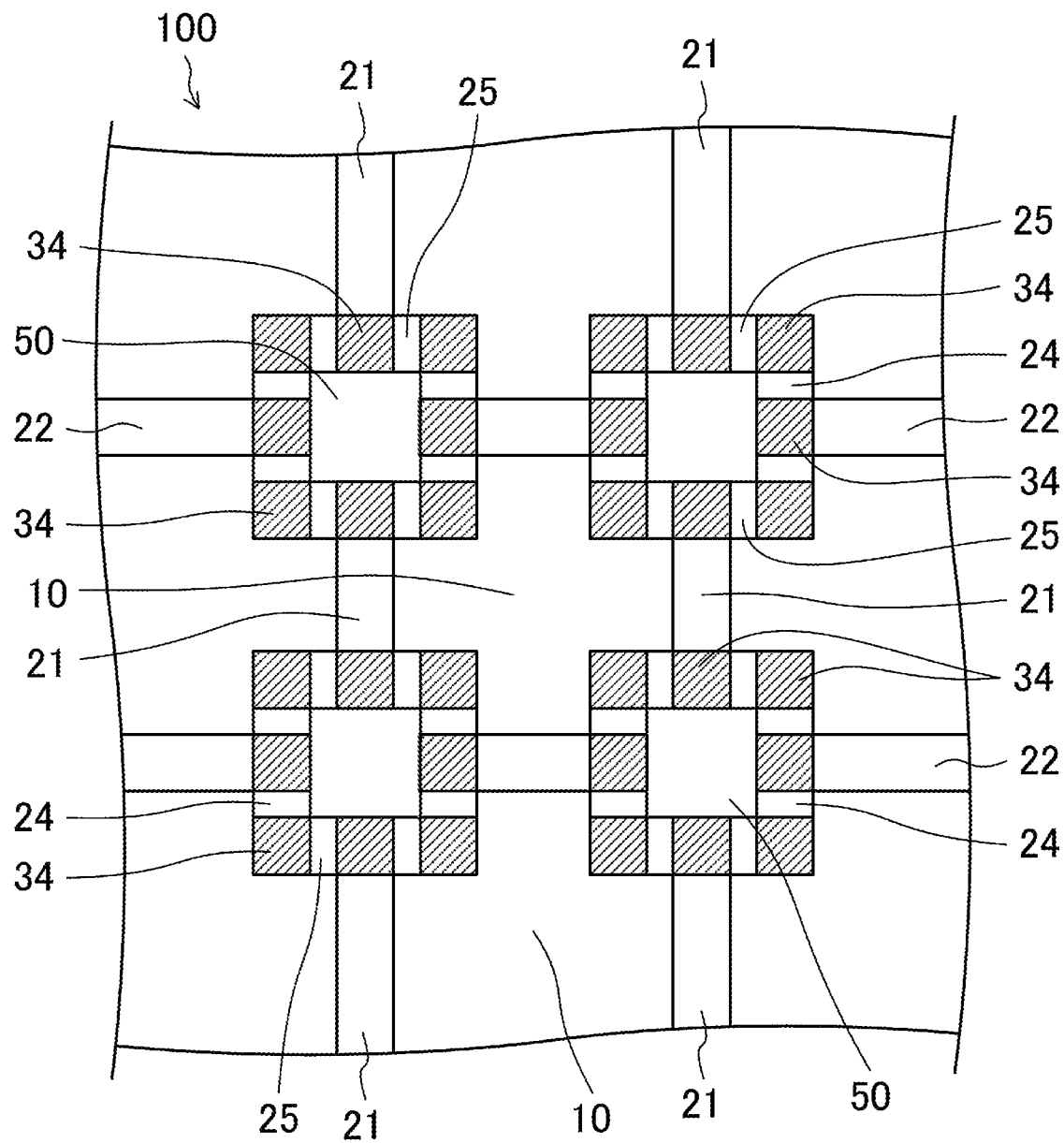
FIG. 15 is a partial plan view illustrating a first modification of an APD layout according to the second embodiment.

FIG. 15 illustrates a planar configuration of the first modification of the APD layout according to the second embodiment. As illustrated in FIG. 15, in the photosensor 100 according to the first modification, the avalanche photodiodes (APDs) 10 are arranged in a lattice pattern. On the other hand, the circuit regions 50 are disposed at opposed corner positions of the APDs 10 adjacent to each other.

As a result, the first isolation region 21 and a fifth isolation region 25 are terminated at a fourth connection portion 34 at which the first isolation region 21 and the fifth isolation region 25 are connected, and the second isolation region 22 and the fourth isolation region 24 are terminated at the fourth connection portion 34 at which the second isolation region 22 and the fourth isolation region 24 are connected. In addition, in the fourth connection portion 34 at which the fourth isolation region 24 and the fifth isolation region 25 are connected, the fourth isolation region 24 and the fifth isolation region 25 are terminated. Therefore, the position dependence of the potential in each of the first isolation region 21, the second isolation region 22, the fourth isolation region 24, and the fifth isolation region 25 is reduced.

[Second Modification of Layout]

Hereinafter, a second modification of the APD layout according to the second embodiment will be described with reference to the drawings.

Figure 16:
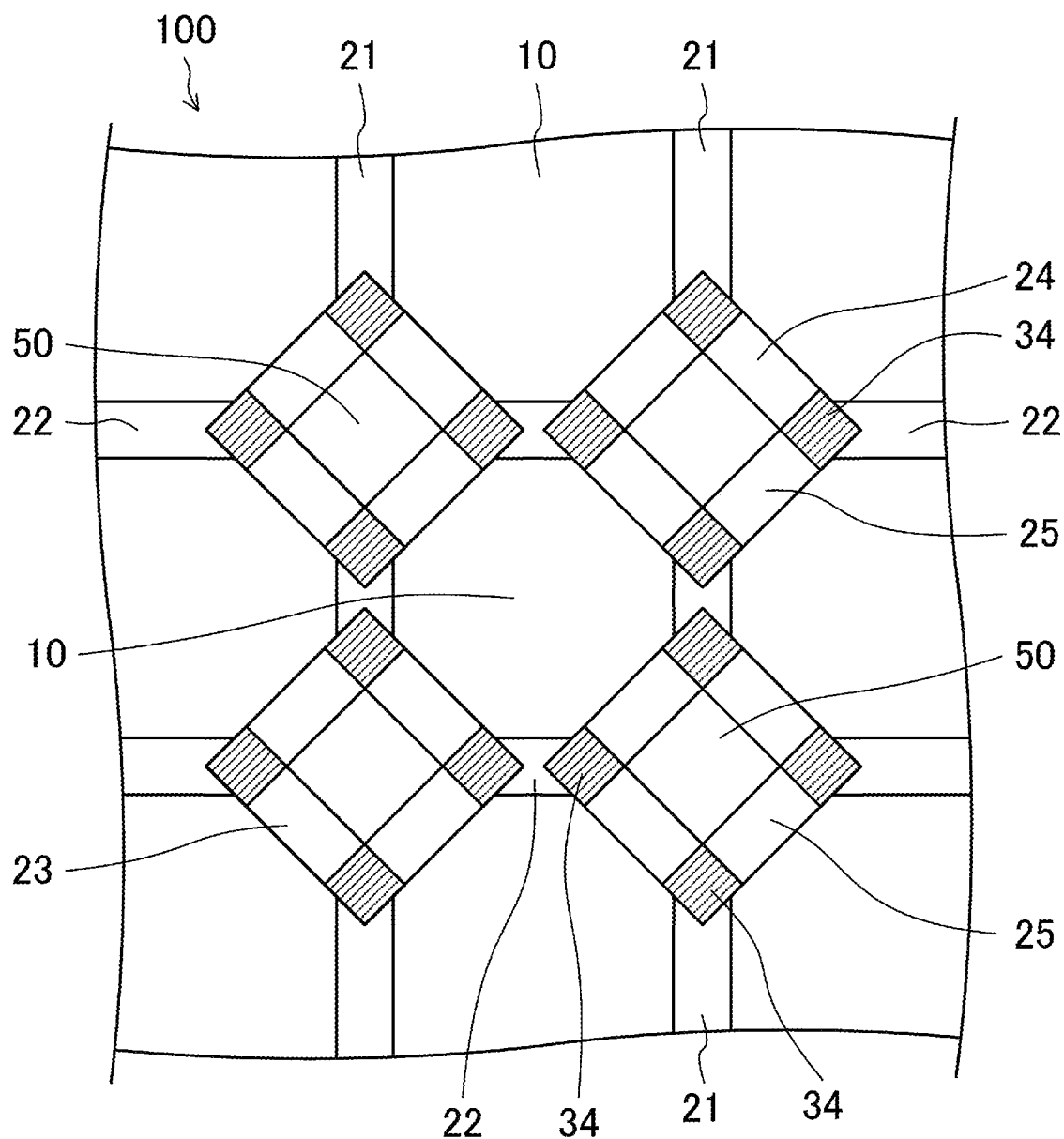
FIG. 16 is a partial plan view illustrating a second modification of the APD layout according to the second embodiment.

FIG. 16 illustrates a planar configuration of the second modification of the APD layout.

As illustrated in FIG. 16, in the APD layout according to the second modification, the circuit region 50 that is a plane quadrangle surrounded by the fourth isolation region 24 and the fifth isolation region 25 orthogonal to each other is disposed to be rotated by 45° with respect to each side portion of the APD 10. Here, the planar shape of the APD 10 may be an octagon.

As a result, the first isolation region 21 and the fifth isolation region 25 are terminated at the fourth connection portion 34 at which the first isolation region 21 and the fifth isolation region 25 are connected, and the second isolation region 22 and the fourth isolation region 24 are terminated at the fourth connection portion 34 at which the second isolation region 22 and the fourth isolation region 24 are connected. In addition, in the fourth connection portion 34 at which the second isolation region 22 and the fifth isolation region 25 are connected, the second isolation region 22 and the fifth isolation region 25 are terminated. Therefore, the electric field in the APD 10 can be made uniform.

Third Embodiment

Hereinafter, a third embodiment will be described with reference to the drawings.

The third embodiment has an array end structure in which a terminal portion is provided around an avalanche photodiode (APD) array in a photosensor.

Figure 17:
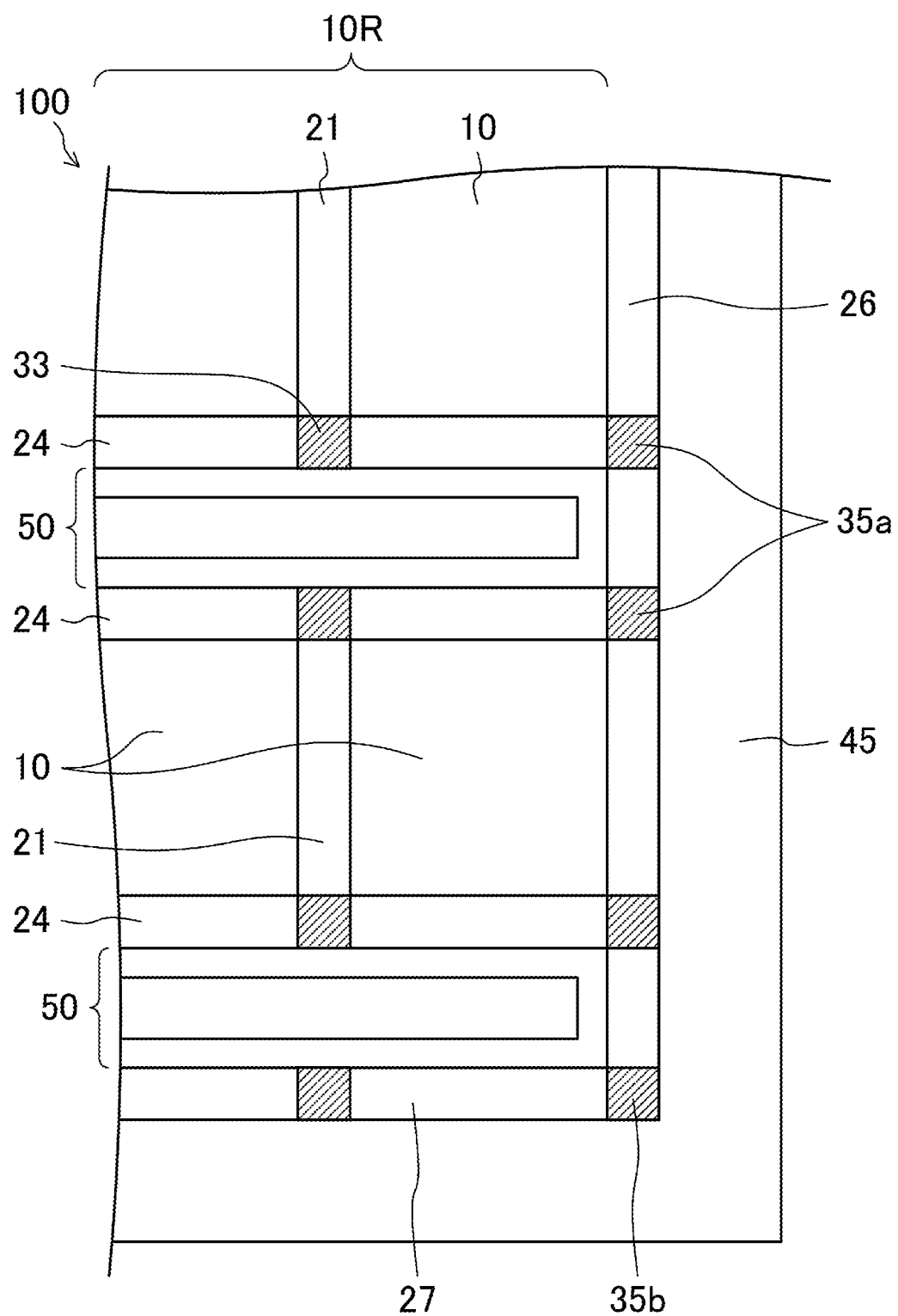
FIG. 17 is a partial plan view illustrating an array end structure of a photosensor array according to a third embodiment.

FIG. 17 illustrates an example of an array end structure of a photosensor according to the third embodiment, and illustrates a region including one corner portion.

As illustrated in FIG. 17, the photosensor 100 includes a terminal portion 45 surrounding an APD array 10R. A sixth isolation region 26 for electrically separating at least either the terminal portion 45 and the APD array 10R from each other, or the terminal portion 45 and the circuit region 50 from each other is provided between the APD array 10R and the terminal portion 45. In addition, a seventh isolation region 27 that electrically separates at least either the terminal portion 45 and the APD array 10R from each other, or the terminal portion 45 and the circuit region 50 from each other, and that is disposed in a direction different from that of the sixth isolation region 26 is provided.

The fourth isolation region 24 that separates the circuit region 50 from the APD 10 is connected to the sixth isolation region 26 at a fifth connection portion 35a, where the fourth isolation region 24 is terminated.

The sixth isolation region 26 and the seventh isolation region 27 are connected to each other at a fifth connection portion 35b at the corner portion of the APD array 10R, where both the sixth isolation region 26 and the seventh isolation region 27 are terminated.

Note that a semiconductor layer of the first conductivity type can be used as the terminal portion 45, and the impurity concentration thereof may be about $10^{15}$ cm$^{-3}$ to $10^{18}$ cm$^{-3}$. In particular, the concentration may be substantially the same as that of the first well 206.

Furthermore, the fourth isolation region 24 is provided between the circuit region 50 and the avalanche photodiode (APD) 10. The fourth isolation region 24 terminates at the sixth isolation region 26 and the fifth connection portion 35a.

As a result, each APD 10 can avoid generation of a high electric field in the terminal portion 45 at the array end, as well, and thus can be further miniaturized.

According to the photosensor 100 of each of the embodiments described above, incident light is incident from above in the drawing, that is, from the side of the wiring layer 2 in the cross-sectional view illustrated in FIG. 2, for example. However, incident light may be incident from the side of the semiconductor substrate 1 in the photosensor 100 according to the present embodiment. That is, the photosensor 100 may be a backside illumination photosensor 100.

In this case, transparent metal that is a transparent electrode is formed on the second main surface S2 of the semiconductor substrate 1. As the transparent metal, indium tin oxide (ITO) or the like can be used, for example. Alternatively, the impurity concentration of the second main surface S2 of the semiconductor substrate 1 may be increased and the second main surface S2 may be used as an electrode.

Fourth Embodiment

Hereinafter, a fourth embodiment will be described with reference to the drawings.

Figure 18:
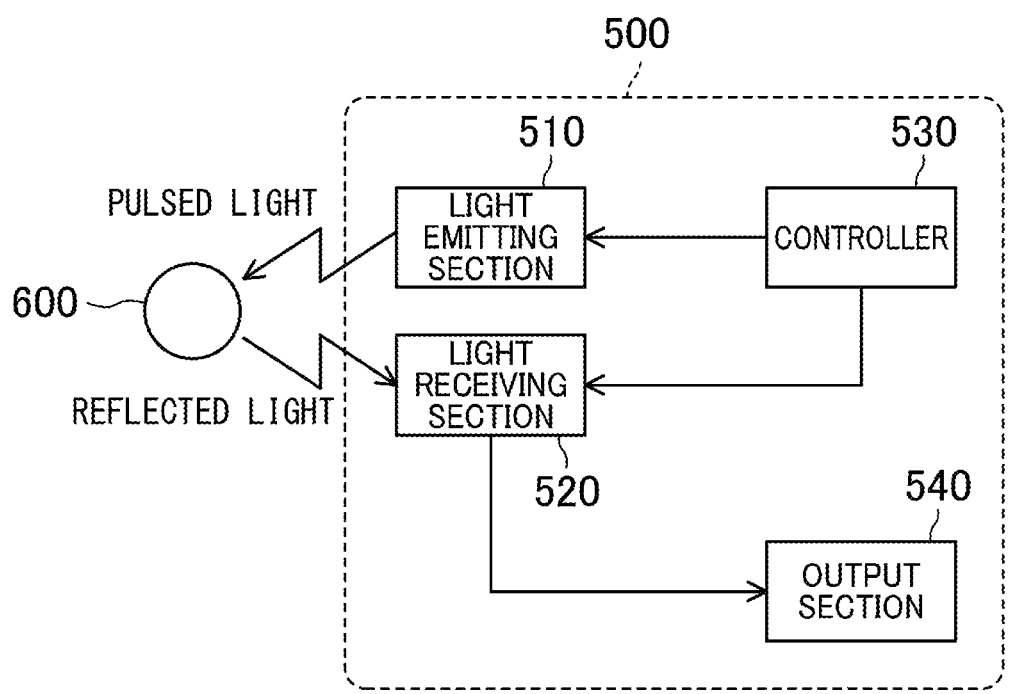
FIG. 18 is a functional block diagram illustrating a distance measuring system according to a fourth embodiment.

FIG. 18 illustrates a fourth embodiment and shows a block configuration of an example of a distance measuring system using the photosensor or an image sensor according to the first to third embodiments.

A distance measuring system 500 according to the fourth embodiment includes a light emitting section 510 that emits pulsed light, a light receiving section 520 that receives reflected pulsed light, a controller 530 that controls the light emitting section 510 and the light receiving section 520, and an output section 540 that outputs a signal from the light receiving section 520.

The light emitting section 510 is comprised of a light emitting device, such as a light emitting diode, generates pulsed light based on a control signal from the controller 530, and irradiates a measurement target 600 with the pulsed light.

The light receiving section 520 is the photosensor or the image sensor according to the embodiments described above, and receives the pulsed light reflected by the measurement target 600.

The controller 530 is comprised of a central processing unit (CPU) or the like, and controls the light emitting section 510 and the light receiving section 520 so that the light emitting section 510 and the light receiving section 520 operate in synchronization with each other. The controller 530 calculates the distance to the measurement target 600 by measuring the time required for the pulsed light to be reflected from the measurement target 600 and return to the light receiving section 520 on the basis of the control signal to the light emitting section 510 and the output signal from the light receiving section 520.

The output section 540 outputs the distance to the measurement target 600 calculated by the controller 530 in a numerical data format or an image format. In general, the output section 540 is comprised of a display, such as a liquid crystal display, an organic EL display, or the like.

The distance measuring system 500 according to the present embodiment is a so-called time of flight (TOF) distance measuring system.

The photosensor or the image sensor according to the present disclosure can arbitrarily set the exposure timing by, for example, the transfer transistor 51 illustrated in FIG. 10. Therefore, by using the photosensor or the image sensor as the distance measuring system 500, it is possible to avoid an erroneous distance detection caused by background light and to obtain the distance to an object with high accuracy.

The present disclosure is useful as a photosensor or an image sensor including an avalanche photodiode that can be miniaturized.

What is claimed is:
1. A photosensor comprising:
a semiconductor substrate including a first main surface and a second main surface opposite to the first main surface;
a plurality of avalanche photodiodes provided on the first main surface;
a first isolation region that is provided on the first main surface and electrically separates the plurality of avalanche photodiodes from one another in a first direction;
a second isolation region that is provided on the first main surface and electrically separates the plurality of avalanche photodiodes from one another in a second direction different from a direction of the first isolation region; and
a first connection portion having sides in plan view, wherein:
the first isolation region is connected to one side of the first connection portion, and the second isolation region is connected another side of the first connection portion,
the first isolation region and the second isolation region are depleted, and
at least one of the sides of the first connection portion is connected to none of the first isolation region and the second isolation region.

2. The photosensor of claim 1, wherein
each of the avalanche photodiodes has a planar quadrangular shape, and
the plurality of avalanche photodiodes are arranged in a staggered manner.

3. The photosensor of claim 1, wherein
each of the plurality of avalanche photodiodes includes a multiplication region including a first semiconductor layer of a first conductivity type and a second semiconductor layer of a second conductivity type,
the second semiconductor layer is formed between the second main surface and the first semiconductor layer,
a voltage is applied to the first semiconductor layer from a first contact provided on the first main surface, and
a voltage is applied to the second semiconductor layer from a second contact formed on the second main surface.

4. The photosensor of claim 3, wherein
each of the avalanche photodiodes includes a photoelectric conversion region, and
the photoelectric conversion region includes the semiconductor substrate, the multiplication region, the first semiconductor layer, and the second semiconductor layer.

5. The photosensor of claim 3, wherein
an absolute value of the voltage applied to the first contact is smaller than an absolute value of the voltage applied to the second contact.

6. The photosensor of claim 1, wherein
the first isolation region or the second isolation region of the first main surface is not in contact with a trench or a contact.

7. The photosensor of claim 1, further comprising
a voltage fixation layer that is provided on the first main surface in parallel with the first isolation region or the second isolation region and is arranged between two first isolation regions or two second isolation regions among the plurality of avalanche photodiodes.

8. The photosensor of claim 1, further comprising
the plurality of avalanche photodiodes at least include first avalanche photodiodes with a first plane area and second avalanche photodiodes with a second plane area different from the first plane area,
the first avalanche photodiodes are arranged in a lattice pattern, and
each of the second avalanche photodiodes is disposed at opposed corner positions of adjacent ones of the first avalanche photodiodes.

9. The photosensor of claim 8, wherein
the first plane area is larger than the second plane area.

10. The photosensor of claim 8, wherein
each of the first avalanche photodiodes has a planar octagonal shape, and
each of the second avalanche photodiodes has a planar quadrangular shape.

11. The photosensor of claim 1, further comprising:
a circuit region provided between the plurality of avalanche photodiodes; and
a fourth isolation region that is depleted and electrically separates each of the avalanche photodiodes from the circuit region, wherein
at least one of the first isolation region, the second isolation region, the third isolation region, or the fourth isolation region is terminated at a third connection portion to which at least two of the first isolation region, the second isolation region, the third isolation region, and the fourth isolation region are connected.

12. The photosensor of claim 11, wherein
the circuit region is disposed between two fourth isolation regions, and
the circuit region and the fourth isolation regions are linearly disposed in the first main surface.

13. The photosensor of claim 11, further comprising:
a fifth isolation region that is depleted, electrically separates each of the avalanche photodiodes from the circuit region, and is provided in a direction different from a direction of the fourth isolation region, wherein
at least one of the fourth isolation region or the fifth isolation region is terminated at a fourth connection portion to which the fourth isolation region and the fifth isolation region are connected.

14. The photosensor of claim 11, wherein:
the plurality of avalanche photodiodes form a photodiode array on the first main surface,
the photosensor further comprises:
a terminal portion that is provided on the first main surface and made of a semiconductor surrounding the photodiode array;
a sixth isolation region that is depleted and electrically separates at least either the terminal portion and the photodiode array from each other, or the terminal portion and the circuit region from each other; and
a seventh isolation region that is depleted, electrically separates at least either the terminal portion and the photodiode array from each other, or the terminal portion and the circuit region from each other, and is provided in a direction different from a direction of the sixth isolation region,
at least one of the first isolation region, the second isolation region, the third isolation region, the fourth isolation region, the fifth isolation region, the sixth isolation region, or the seventh isolation region is terminated at a sixth connection portion to which at least two of the first isolation region, the second isolation region, the third isolation region, the fourth isolation region, the fifth isolation region, the sixth isolation region, and the seventh isolation region are connected.

15. The photosensor of claim 1, wherein:
the plurality of avalanche photodiodes form a photodiode array on the first main surface,
the photosensor further comprises:
a terminal portion that is provided on the first main surface and made of a semiconductor surrounding the photodiode array;
a sixth isolation region that is depleted and electrically separates the terminal portion from the photodiode array; and
a seventh isolation region that is depleted, electrically separates the terminal portion from the photodiode array, and is provided in a direction different from a direction of the sixth isolation region,
at least one of the first isolation region, the second isolation region, the third isolation region, the sixth isolation region, or the seventh isolation region is terminated at a fifth connection portion to which at least two of the first isolation region, the second isolation region, the third isolation region, the sixth isolation region, and the seventh isolation region are connected.

16. A distance measuring system using the photosensor of claim 1.

17. A photosensor comprising:
a semiconductor substrate including a first main surface and a second main surface opposite to the first main surface;
a plurality of avalanche photodiodes provided on the first main surface;
a first isolation region that is provided on the first main surface and electrically separates the plurality of avalanche photodiodes from one another in a first direction;
a second isolation region that is provided on the first main surface and electrically separates the plurality of avalanche photodiodes from one another in a second direction different from a direction of the first isolation region; and
a third isolation region that is depleted, provided on the first main surface, and electrically separates the plurality of avalanche photodiodes from one another in a third direction different from directions of the first isolation region and the second isolation region, wherein:

the first isolation region and the second isolation region are depleted, at least one of the first isolation region or the second isolation region is terminated at a first connection portion to which the first isolation region and the second isolation region are connected, and at least one of the first isolation region, the second isolation region, or the third isolation region is terminated at a second connection portion to which at least two of the first isolation region, the second isolation region, and the third isolation region are connected.

18. The photosensor of claim 17, wherein each of the avalanche photodiodes has a planar hexagonal shape, and the plurality of avalanche photodiodes are arranged in a honeycomb pattern.

* * * * *